United States Patent [19]

Toyonaga et al.

[11] Patent Number: 5,159,682

[45] Date of Patent: Oct. 27, 1992

[54] SYSTEM FOR OPTIMIZING A PHYSICAL ORGANIZATION OF ELEMENTS OF AN INTEGRATED CIRCUIT CHIP THROUGH THE CONVERGENCE OF A REDUNDANCY FUNCTION

[75] Inventors: Masahiko Toyonaga; Toshiro Akino; Hiroaki Okude, all of Osaka, Japan

[73] Assignee: Matsushita Electric Industrial Co., Ltd., Osaka, Japan

[21] Appl. No.: 426,957

[22] Filed: Oct. 26, 1989

[30] Foreign Application Priority Data

Oct. 28, 1988 [JP] Japan ................. 63-273433

[51] Int. Cl.⁵ ............................... G06F 9/44
[52] U.S. Cl. ................... 395/500; 364/148; 364/491; 364/933.8; 364/DIG. 2; 364/232.3; 364/DIG. 1
[58] Field of Search ........... 364/200, 900, 491, 148, 364/488, 489, 490; 395/500

[56] References Cited

U.S. PATENT DOCUMENTS

| | | | |
|---|---|---|---|
| 3,654,615 | 4/1972 | Freitag | 364/491 |
| 3,681,782 | 8/1972 | Scanlon | 364/491 |
| 4,495,559 | 1/1985 | Gelatt et al. | 364/148 |
| 4,615,011 | 9/1986 | Linsker | 364/491 |
| 4,630,219 | 12/1986 | DiGiacomo et al. | 364/488 |
| 4,754,408 | 6/1988 | Carpenter et al. | 364/491 |
| 4,931,944 | 6/1990 | Richter et al. | 364/468 |
| 4,964,057 | 10/1990 | Yabe | 364/491 |

OTHER PUBLICATIONS

IEEE Journal of Solid-State circuits, vol. SC-20, No. 2, Apr. 1985, New York US pp. 510-522; Sechen et al: 'the timberwolf placement and routing package' *p. 510, column 2, line 33-p. 512, column 2, line 31**p. 513, column 1, line 26-p. 514, column 2, line 8*.
Science, vol. 200, No. 4598, May 13, 1983, pp. 671-680; Kirkpatrick et al: 'optimization by simulated annealing'.
IEEE Transactions on Computer Aided Design of Integrated Circuits and Systems, vol. CAD-6, No. 2, Mar. 1987, New York US pp. 211-221; Siarry et al: 'Thermodynamic Optimization of Block Placement'.

*Primary Examiner*—Thomas C. Lee
*Assistant Examiner*—Paul Harrity
*Attorney, Agent, or Firm*—Lowe, Price, LeBlanc & Becker

[57] ABSTRACT

During an optimization of an organization of mutually-related elements, an element organization is gradually changed toward an objective specification by local changes of the element organization. A value of an objective function depends on a degree of a nearness of the element organization to the objective specification. A redundancy function of a number of elements in an improvement group is determined in consideration of a fluctuation in the value of the objective function, so that suitable changes of the improvement group are performed by use of the definite redundancy. An intermediate element organization is rejected and accepted in accordance with the redundancy function value, so that a final element organization can be obtained in consideration of a global aspect of the element organization.

6 Claims, 18 Drawing Sheets

FIG. 10(a)

```c
# include    <stdio.h>
# include    <math.h>
/*   Size of the improvement group    */
int     W, Winit, Wmin ;
int     Basic_iteration, N, M, size     ;
/*   Orignal point of the improvement group   */
int     xo, yo ;
/*   Iteration for improvement */
int     in_loop, out_loop ;
int     city1, city2 ;
/*   Objective function */
int     F() ;
/*   Redundace control parameters */
double  Alpha   ;
int     Fr, Red, dF          ;
/*   Other parameters */
int     Fo, Fav, Av_count    ;
int     Fn, Fnow             ;
int     xrand = 50249347 ;
/*   Other functions */
int     generate_city_data(), generate_path_data() ;
int     initial_placement() ;
int     exchange_city(), recover_city() ;
int     mod(), random() ;
/*   Other memory */
struct  city_to_city ( int  city1, city2; ) city_con[20];
struct  xy_of_city  ( int  x, y; ) city_xy[20] ;
int     city_map[5][5]   ;
double  sqrt() ;
int     imp_grp[17] ;
double  dfloat() ;
int     abs()     ;

main()
{
        /*   set initial data for optimization       */
        Alpha = 0.9 ; /* Redundance paramter or Concentration parameter*/
        Winit = 4 * 4 ; /* Initial size of the improvement group */
        Wmin = 2 * 2 ; /* Final size of the improvement group */
        Basic_iteration = 20 * Winit ;/* Arbtraly number * Winit */

/*   make test data of the travelling salesman    */
        generate_city_data() ; generate_path_data() ;
        dump_city_map() ;
        /*   prepare the redundace function    */
        Fr = 2*( Winit + Wmin ) ; /* Redundace = (Fr /Winit)*W   */

/*   prepare the initial placement */
        W = Winit           ;
        initial_placement() ;
```

FIG. 10(b)

```
/* Before procedure */
Fav = F() ; Fnow = F() ;
do {
        /*calculate the redundace value */
        Red = Fr * W / Winit ;

/* set iteration numbers for each loops */
        N = W ; M = Basic_iteration / N ;
        size = sqrt(W) ;
        if ( W == Wmin ) Red = 0 ; /* When the final improvement */

/* repeat untill F() becomes worse than Fo    */
        do {
                Fo = Fav ;
                /* calculate the cost before the improvement */
                /* initialize the counters */
                Fav = 0 ; Av_count = 0 ;
                for ( out_loop = 1 ; out_loop <= M ; out_loop ++ ) {
                        /* select origin point of the improve_group */
                        xo = mod ( random(), 4 - size + 1 ) ;
                        yo = mod ( random(), 4 - size + 1 ) ;
                        save_group ( xo, yo, size ) ;
                        for ( in_loop = 1 ; in_loop <= N ; in_loop ++ ) {
                                /*exchange city */
                                exchange_city () ;
                                Fn = F() ; dF = Fn - Fnow ;
                                if ( dfloat( dF ) <= Alpha * dfloat(Red) ) {
                                        /* accept the new state */
                                        Fnow = Fn ;
                                } else {
                                        /* reject the new state */
                                        swap_city () ;
                                }
                                /*process           */
                                Fav = Fav + Fnow ;
                                Av_count = Av_count + 1 ;
                        }
                }
                Fav = Fav / Av_count ;
                printf ( " * Object function F() = %d\n", Fnow ) ;
        } while ( Fo > Fav ) ;

/* reduce the size of the improve_group */
        W = dfloat( W ) * Alpha ;

/* repeat if more improvement is expected */
} while ( W >= Wmin && Red != 0.0 ) ;

/* End procedure */
dump_city_map() ;
}
```

FIG. 10(c)

```
/************************************************************/
/*** Function gen_city  : generate city data             ***/
/************************************************************/
generate_city_data()
{
int     x, y, city ;
        city = 0 ;
/***    set city                          ***/
        for ( y = 0 ; y < 4 ; y++ ) {
                for ( x = 0 ; x < 4 ; x++ ) {
                        city_xy[ city ].x = x ;
                        city_xy[ city ].y = y ;
                        city_map[ x ][ y ] = city ;
                        city++ ;
                }
        }
}
/************************************************************/
/*** Function gen_path  : generate path data             ***/
/************************************************************/
generate_path_data()
{
int     path ;
int     city ;
        city = 0 ;
        for ( path = 0 ; path < 16 ; path++ ) {
                city_con[ path ].city1 = city ;
                city_con[ path ].city2 = city + 1 ;
                city++ ;
        }
        city_con[ 15 ].city2 = 0 ;
}
/************************************************************/
/*** Function initial_placement : generate random placement ***/
/************************************************************/
initial_placement()
{
int     i      ;
        xo = 0 ; yo = 0 ; size = 4 ;
        save_group ( xo, yo, size ) ;
        Fo = F() ; Fnow = F() ;
        for ( i = 1 ; i <= Basic_iteration ; i++ ) {
                exchange_city() ;
        }
}
```

FIG. 10(d)

```
/*****************************************************************/
/*** Function save_group       : save_group of city           ***/
/*****************************************************************/
save_group( xo, yo, size )
int     xo, yo, size ;
{
int     x, y, city, i   ;

/* select pair */
        city = 0 ;
        for ( x = xo ; x < xo + size ; x ++ ) {
                for ( y = yo ; y < yo + size ; y ++ ) {
                        imp_grp[city] = city_map[x][y] ;
                        city ++ ;
                }
        }
}
/*****************************************************************/
/*** Function exchange_city    : exchange city pair           ***/
/*****************************************************************/
exchange_city()
{
int     xo, yo, size ;
int     irand() ;
int     mod()   ;
int     c1, c2  ;

/* select pair */
        c1 = mod( irand(), W ) ; c2 = mod( irand(), W ) ;
        while ( c1 == c2 ) {
                c2 = mod( irand(), W ) ;
        }
        city1 = imp_grp[c1] ; city2 = imp_grp[c2] ;
        /* exchange pairs      */
        swap_city() ;
}
/*****************************************************************/
/*** Function swap_city : swap city pair                      ***/
/*****************************************************************/
swap_city()
{
        int     x1, y1, x2, y2 ;
        x1 = city_xy [city1].x ; y1 = city_xy [city1].y ;
        x2 = city_xy [city2].x ; y2 = city_xy [city2].y ;
        city_map[ x1 ][ y1 ] = city2 ;
        city_map[ x2 ][ y2 ] = city1 ;
        city_xy[city1].x = x2 ; city_xy[city1].y = y2 ;
        city_xy[city2].x = x1 ; city_xy[city2].y = y1 ;
}
```

FIG. 10(e)

```
/*********************************************************************/
/*** Function F() : calculate cost                                 ***/
/*********************************************************************/
int     F()
{
        int     net     ;
        int     wx, wy  ;
        int     cost    ;
        int     c1, c2  ;

cost = 0 ;
        for ( net = 0 ; net < 16 ; net++ ) {
                c1 = city_con[net].city1 ;
                c2 = city_con[net].city2 ;
                wx = city_xy[ c1 ].x - city_xy[ c2 ].x ;
                wy = city_xy[ c1 ].y - city_xy[ c2 ].y ;
                cost = cost + wx*wx + wy*wy ;
        }
        return ( cost ) ;
}
/*********************************************************************/
/*** Function dump_placement    : map dump                         ***/
/*********************************************************************/
dump_city_map()
{
int     x, y, city      ;
        printf ( "\n" ) ;
        for ( y = 0 ; y < 4 ; y++ ) {
                for ( x = 0 ; x < 4 ; x++ ) {
                        printf( " %3d", city_map[ x ][ y ] ) ;
                }
                printf ( "\n" ) ;
        }
}
/*********************************************************************/
/*** Other Functions                                               ***/
/*********************************************************************/
int     mod( a, b )
int     a, b ;
{
        int     ans     ;
        int     amari   ;
        ans = a / b ;
        amari = a - ans * b ;
        return ( amari ) ;
}
double  dfloat(n) int   n; { double     f ; f = n ; return (f) ; }
int     irand()
{
        int     abs()   ;
        int     iirand  ;
        iirand = xrand * 329    ;
        xrand = abs( iirand - iirand / 100000001 * 100000001 ) ;
        return ( xrand ) ;
}
```

* Object function F() = 108
* Object function F() = 70
* Object function F() = 90
* Object function F() = 68
* Object function F() = 80
* Object function F() = 62
* Object function F() = 106
* Object function F() = 72
* Object function F() = 114
* Object function F() = 66
* Object function F() = 70
* Object function F() = 88
* Object function F() = 92
* Object function F() = 102
* Object function F() = 64
* Object function F() = 92
* Object function F() = 50
* Object function F() = 110
* Object function F() = 70
* Object function F() = 70
* Object function F() = 76
* Object function F() = 78 ← E1
* Object function F() = 84 ← E2
* Object function F() = 56 ← E3
* Object function F() = 20
* Object function F() = 20
* Object function F() = 16
* Object function F() = 16

```
13 12 11 10
14 15  8  9
 1  0  7  6
 2  3  4  5
```

SYSTEM FOR OPTIMIZING A PHYSICAL ORGANIZATION OF ELEMENTS OF AN INTEGRATED CIRCUIT CHIP THROUGH THE CONVERGENCE OF A REDUNDANCY FUNCTION

BACKGROUND OF THE INVENTION

1. Field of the Invention

This invention relates to a method and an apparatus for optimizing an organization of many discrete elements.

2. Description of the Prior Art

Recently, computers have been used to derive an optimal organization of discrete elements. In respect of a group of a small number of discrete elements, it has been possible to determine an optimal organization, which satisfies an objective specification, by examining all possible organizations which the element group can take. However, the method including the process of examining all possible organizations tends to be impractical in determining an optimal organization of a large number of discrete elements with many constraints because the number of the possible organizations exponentially increases and a CPU cost greatly increases with increases in the numbers of the elements and the constraints. In the field where an optimal organization of many discrete elements affects the usefulness of designing, such an increase in the CPU cost causes problems that a time spent in the designing is long and a computer cost is high.

Such an optimization of an organization of many discrete elements is necessary for the resolution of a cell assignment problem of a logical functional element mask (a cell element mask) in circuit mask layout of the standard-cell type or the gate-array type in the fabrication of a semiconductor device. In the standard-cell layout method or the gate-array layout method, an optimal assignment organization of a group of cell elements which satisfies an objective specification of LSI mask layout must be determined by using previously-prepared cell element groups composing a device to be formed on a semiconductor substrate, and by using logical net information representing the relation among the cell element groups. The objective specification of LSI mask layout means the determination of a cell element assignment organization which satisfies a plurality of conditions such as a minimization of the chip area size and a minimization of the estimated total wire length. In respect of a cell element group having 20,000 or more elements, a cell assignment problem in the standard-cell layout method or the gate-array layout method can not be easily resolved by examining all possible organizations to determine an optimal organization. Accordingly, an inexpensive and quick optimization of an organization has been desired in such a large number of discrete elements.

U.S. Pat. No. 3,654,615 relates to an element placement system in which a first element organization is modified into a second element organization; an objective function value representing the degree of the nearness of the second element organization to an objective specification is calculated; the objective function value is examined to determine whether or not an improvement is present; and such processes are repeated to find an element organization well matching to the objective specification. In general, the element organization which is obtained through the repetition of a local change is far from an objective specification than the element organization which is obtained through the repetition of a global change is. In U.S. Pat. No. 3,654,615, since the improvement of an element organization is performed through only local changes, a finally-obtained element organization tends to be inferior to a final element organization tends to be inferior to a final element organization obtained through global changes.

U.S. Pat. No. 4,495,559 relates to an optimization of an organization of discrete elements which considers a global element organization. In U.S. Pat. No. 4,495,559, an attention is paid to a natural phenomenon of annealing in which an organization of atoms and molecules of a substance gradually changes from a disordered state to an energy-lowest ground state during the gradually cooling (annealing) of the substance from a high temperature state to a low temperature state. In addition, U.S. Pat. No. 4,495,559 uses the fact that a computer simulation can reproduce such a phenomenon. In the optimization of U.S. Pat. No. 4,495,559, elements are regarded as atoms or molecules composing the substance, and the objective function, which enables the degree of the nearness to an objective specification to be represented by a numeral value, is regarded as energy. Since the minimization of energy is caused in dependence upon the global conditions of the substance, the optimization of U.S. Pat. No. 4,495,559 considers a global aspect of the element organization. Since such a method of simulated annealing can be applied to a substance having any complicated factors, the method considers a global aspect of the element organization rather than a local aspect and can obtain an excellent optimal organization regardless of the type of a constraint and the number of elements. A temperature parameter and a cooling schedule parameter greatly affect a finally-obtained element organization in the method of simulated annealing. The cooling schedule parameter determines a rate at which the temperature parameter is lowered. A heat equilibrium state is used as a reference for judging conditions of processes at respective temperatures which enable changes of the temperatures to next values. The optimization of U.S. Pat. No. 4,495,559 has difficulty in determining the temperature parameter and the cooling schedule parameter, and establishing the heat equilibrium state. Various computer simulations teach the following facts. To derive an element organization which satisfies an objective specification, it is necessary that an initial temperature parameter is set as high as possible, and a final temperature parameter is set as low as possible, and that a cooling schedule parameter is set close to 1 so as to lower the temperature as slow as possible. As understood from the previous description, the optimization of U.S. Pat. No. 4,495,559 tends to require a very high CPU cost. Furthermore, according to the optimization of U.S. Pat. No. 4,495,559, it is generally difficult to confirm that the processing is performed under optimal conditions.

SUMMARY OF THE INVENTION

It is an object of this invention to provide an excellent method and an excellent apparatus for optimizing an organization of many discrete elements.

According to a first aspect of this invention, a method of optimizing an organization of mutually-related elements, wherein the element organization is gradually changed toward an objective specification by local changes of the element organization, comprises a first step including sub steps of defining an objective function whose value depends on a degree of a nearness of an element organization to an objective specification, determining an iteration number of improvement for an improvement group of elements, an iteration number of improvement for whole elements, an initial number of elements in an improvement group, a smallest number of elements in an improvement group, and a concentration parameter, and generating an initial element organization; a second step of calculating a redundancy function depending on a number of elements in an improvement group; a third step including sub steps of selecting one of the elements at random and setting an improvement group of elements whose origin agrees with the selected element; a fourth step including sub steps of changing a current element organization to a new element organization by performing at least one of exchange and movement of elements in the improvement group, calculating a value of the objective function of the current element organization and a value of the objective function of the new element organization, calculating a difference between the values of the objective functions of the current element organization and the new element organization, calculating a degree of redundancy on the basis of a product of the concentration parameter and a value of the redundancy function, judging whether or not the objective function value difference is greater than the degree of redundancy, rejecting the new element organization and maintaining the current element organization when the objective function value difference is greater than the degree of redundancy, accepting the new element organization when the objective function value difference is not greater than the degree of redundancy, and reiterating said sub steps of the fourth step a number of times which agrees with the iteration number of improvement for an improvement group, wherein said third step and said fourth step correspond to a whole element organization improving process; a fifth step including sub steps of reiterating the whole element organization improving process a number of times which agrees with the iteration number of improvement for whole elements, calculating a value of the objective function which occurs after said reiterating of the whole element organization improving process, judging whether or not the objective junction value which occurs after said reiterating of the whole element organization improving process is smaller than the objective function value which occurs before said reiterating of the whole element organization improving process, further repeating the whole element organization improving process a number of times which agrees with the iteration number of improvement for whole elements when the objective function value which occurs after said reiterating of the whole element organization improving process is smaller than the objective functiong value which occurs before said reiterating of the whole element organization improving process, and performing a sixth step when the objective function value which occurs after said reiterating of the whole element organization improving process is not smaller than the objective function value which occurs before said reiterating of the whole element organization improving process; a sixth step of multiplying the current number of elements in an improvement group by the concentration parameter to change the current number of elements in an improvement group into a new number of elements in an improvement group; a seventh step including sub steps of judging whether or not the new number of elements in an improvement group is greater than the smallest number of elements in an improvement group, calculating a value of the redundancy function related to the new number of elements in an improvement group and then performing said third step when the new number of elements in an improvement group is greater than the smallest number of elements in an improvement group, judging whether or not the value of the redundancy function is equal to 0 when the new number of elements in an improvement group is not greater than the smallest number of elements in an improvement group, setting the value of the redundancy function to 0 and then performing the third step when the value of the redundancy function is not equal to 0, and performing an eighth step when the value of the redundancy function is equal to 0; and an eighth step of outputting a finally-obtained element organization which corresponds to an optimal element organization.

According to a second aspect of this invention, a method of optimizing a placement of elements having mutual relations therebetween, wherein degrees of the mutual relations between the elements are represented by distances between the elements and the element placement is gradually changed toward an objective specification by local changes of the element placement, comprises a first step including sub steps of defining an objective function whose value depends on the distances between the elements and on a degree of a nearness of an element placement to an objective specification, determining an iteration number of improvement for an improvement group of elements, an iteration number of improvement for whole elements, an initial number of elements in an improvement group, a smallest number of elements in an improvement group, and a concentration parameter, and generating an initial element placement; a second step of calculating a redundancy function depending on an area of an improvement group of elements; a third step including sub steps of selecting one of the elements at random and setting an improvement group of elements whose origin agrees with the selected element; a fourth step including sub steps of changing a current element placement to a new element placement by performing at least one of exchange and movement of elements in the improvement group, calculating a value of the objective function of the current element placement and a value of the objective function of the new element placement, calculating a difference between the values of the objective functions of the current element placement and the new element placement, calculating a degree of redundancy on the basis of a product of the concentration parameter and a value of the redundancy function, judging whether or not the objective function value difference is greater than the degree of redundancy, rejecting the new element placement and maintaining the current element placement when the objective function value difference is greater than the degree of redundancy, accepting the new element placement when the objective function value difference is not greater than the degree of redundancy, and reiterating said sub steps of the fourth step a number of times which agrees with the iteration number of improvement for an improvement group wherein said third step and said fourth step correspond to a whole element placement improving process; a fifth step including sub steps of reiterating the whole element placement improving process a number of times which agrees with the iteration number of improvement for whole elements, calculating an average of values of the objective function which occur after said reiterating of the whole element placement improving process, judging whether or not the objective function value average which occurs after said reiterating of the whole element placement improving process is smaller than an average of the objective function values which occur before said reiterating of the whole element placement improving process, further repeating the whole element placement improving process a number of times which agrees with the iteration number of improvement for whole elements when the objective function value average which occurs after said reiterating of the whole element placement improving process is smaller than the objective function value average which occurs before said reiterating of the whole element placement improving process, and performing a sixth step when the objective function value average which occurs after said reiterating of the whole element placement improving process is not smaller than the objective function value average which occurs before said reiterating of the whole element placement improving process; a sixth step of multiplying the current number of elements in an improvement group by the concentration parameter to change the current number of elements in an improvement group to a new number of elements in an improvement group; a seventh step including sub steps of judging whether or not the new number of elements in an improvement group is greater than the smallest number of elements in an improvement group, calculating a value of the redundancy function related to the new number of elements in an improvement group and then performing said third step when the new number of elements in an improvement group is greater than the smallest number of elements in an improvement group, judging whether or not the value of the redundancy function is equal to 0 when the new number of elements in an improvement group is not greater than the smallest number of elements in an improvement group, setting the value of the redundancy function to 0 and then performing the third step when the value of the redundancy function is not equal to 0, and performing an eighth step when the value of the redundancy function is equal to 0; and an eighth step of outputting a finally-obtained element placement which corresponds to an optimal element placement.

According to a third aspect of this invention, an apparatus for optimizing an organization of mutually-related elements, wherein the element organization is gradually changed toward an objective specification by local changes of the element organization, comprises first means for defining an objective function whose value depends on a degree of a nearness of an element organization to an objective specification, determining an iteration number of improvement for an improvement group of elements, an iteration number of improvement for whole elements, an initial number of elements in an improvement group, a smallest number of elements in an improvement group, and a concentration parameter, and generating an initial element organization; second means for calculating a redundancy function depending on a number of elements in an improvement group; third means for selecting one of the elements at random and setting an improvement group of elements whose origin agrees with the selected element; fourth means for changing a current element organization to a new element organization by performing at least one of exchange and movement of elements in the improvement group calculating a value of the objective function of the current element organization and a value of the objective function of the new element organization, calculating a difference between the values of the objective functions of the current element organization and the new element organization, calculating a degree of redundancy on the basis of a product of the concentration parameter and a value of the redundancy function, judging whether or not the objective function value difference is greater than the degree of redundancy, rejecting the new element organization and maintaining the current element organization when the objective function value difference is greater than the degree of redundancy, accepting the new element organization when the objective function value difference is not greater than the degree of redundancy, and reiterating said functions of the fourth means a number of times which agrees with the iteration number of improvement for an improvement group, wherein said third means and said fourth means correspond to a whole element organization improving process; fifth means for reiterating the whole element organization improving process a number of times which agrees with the iteration number of improvement for whole elements, calculating a value of the objective function which occurs after said reiterating of the whole element organization improving process, judging whether or not the objective function value which occurs after said reiterating of the whole element organization improving process is smaller than the objective function value which occurs before said reiterating of the whole element organization improving process, further repeating the whole element organization improving process a number of times which agrees with the iteration number of improvement for whole elements when the objective function value which occurs after said reiterating of the whole element organization improving process is smaller than the objective function value which occurs before said reiterating of the whole element organization improving process, and performing a function of sixth means when the objective function value which occurs after said reiterating of the whole element organization improving process is not smaller than the objective function value which occurs before said reiterating of the whole element organization improving process; sixth means for multiplying the current number of elements in an improvement group by the concentration parameter to change the current number of elements in an improvement group into a new number of elements in an improvement group; seventh means for judging whether or not the new number of elements in an improvement group is greater than the smallest number of elements in an improvement group, calculating a value of the redundancy function related to the new number of elements in an improvement group and then performing said function of the third means when the new number of elements in an improvement group is greater than the smallest number of elements in an improvement group, judging whether or not the value of the redundancy function is equal to 0 when the new number of elements in an improvement group is not greater than the smallest number of elements in an improvement group, setting the value of the redundancy function to 0 and then performing said function of the third means when the value of the redundancy function is not equal to 0, and performing a function of an eighth means when the value of the redundancy function is equal to 0; and eighth means for outputting a finally-obtained element organization which corresponds to an optimal element organization.

According to a fourth aspect of this invention, an apparatus for optimizing a placement of elements having mutual relations therebetween, wherein degrees of the mutual relations between the elements are represented by distances between the elements and the element placement is gradually changed toward an objective specification by local changes of the element placement, comprises first means for defining an objective function whose value depends on the distances between the elements and on a degree of a nearness of an element placement to an objective specification, determining an iteration number of improvement for an improvement group of elements, an iteration number of improvement for whole elements, an initial number of elements in an improvement group, a smallest number of elements in an improvement group, and a concentration parameter, and generating an initial element placement; second means for calculating a redundancy function depending on an area of an improvement group of elements; third means for selecting one of the elements at random and setting an improvement group of elements whose origin agrees with the selected element; fourth means for changing a current element placement to an new element placement by performing at least one of exchange and movement of elements in the improvement group, calculating a value of the objective function of the current element placement and a value of the objective function of the new element placement, calculating a difference between the values of the objective functions of the current element placement and the new element placement, calculating a degree of redundancy on the basis of a product of the concentration parameter and a value of the redundancy function, judging whether or not the objective function value difference is greater than the degree of redundancy, rejecting the new element placement and maintaining the current element placement when the objective function value difference is greater than the degree of redundancy, accepting the new element placement when the objective function value difference is not greater than the degree of redundancy, and reiterating said functions of the fourth means a number of times which agrees with the iteration number of improvement for an improvement group, wherein said functions of the third means and the fourth means correspond to a whole element placement improving process; fifth means for reiterating the whole element placement improving process a number of times which agrees with the iteration number of improvement for whole elements, calculating an average of values of the objective function which occur after said reiterating of the whole element placement improving process, judging whether or not the objective function value average which occurs after said reiterating of the whole element placement improving process is smaller than an average of the objective function values which occur before said reiterating of the whole element placement improving process, further repeating the whole element placement improving process a number of times which agrees with the iteration number of improvement for whole elements when the objective function value average which occurs after said reiterating of the whole element placement improving process is smaller than the objective function value average which occurs before said reiterating of the whole element placement improving process, and performing a function of a sixth means when the objective function value average which occurs after said reiterating of the whole element placement improving process is not smaller than the objective function value average which occurs before said reiterating of the whole element placement improving process; sixth means for multiplying the current number of elements in an improvement group by the concentration parameter to change the current number of elements in an improvement group into a new number of elements in an improvement group; seventh means for judging whether or not the new number of elements in an improvement group is greater than the smallest number of elements in an improvement group, calculating a value of the redundancy function related to the new number of elements in an improvement group and then performing said function of the third means when the new number of elements in an improvement group is greater than the smallest number of elements in an improvement group, judging whether or not the value of the redundancy function is equal to 0 when the new number of elements in an improvement group is not greater than the smallest number of elements in an improvement group, setting the value of the redundancy function to 0 and then performing said function of the third means when the value of the redundancy function is not equal to 0, and performing a function of eighth means when the value of the redundancy function is equal to 0; and eighth means for outputting a finally-obtained element placement which corresponds to an optimal element placement.

BRIEF DESCRIPTION OF THE DRAWINGS

FIGS. 10(a)-10(e) are lists of computer programs which relate to the travelling salesman problem.

FIG. 11 is a list showing the relation between the objective function and the number of times of the execution of a reiterative part of the computer programs which relate to the travelling salesman problem.

DESCRIPTION OF THE PREFERRED EMBODIMENT

Figure 13:
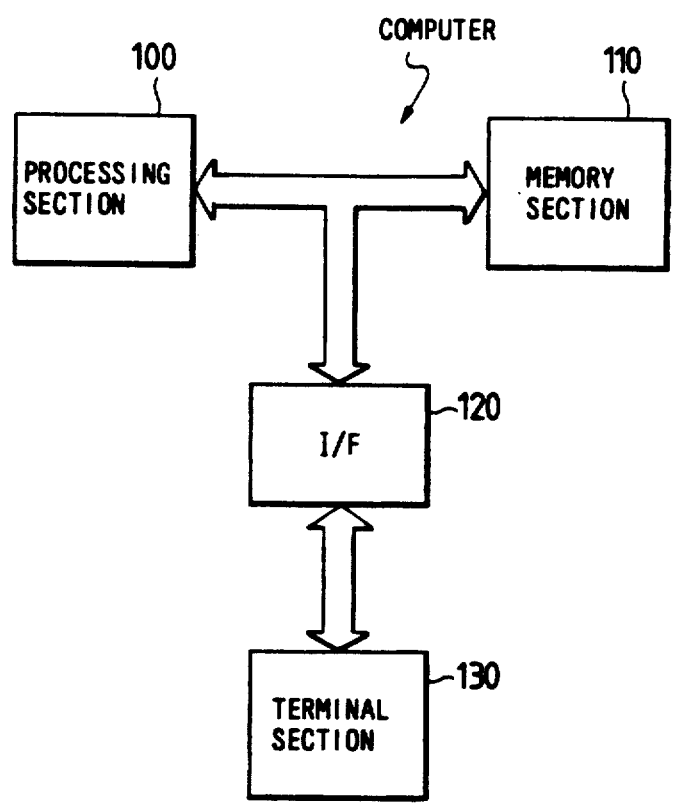
FIG. 13 is a block diagram of a computer used in the optimization system of FIG. 1.

An optimization system according to an embodiment of this invention is realized by a computer. As shown in FIG. 13, the computer includes a combination of a processing section 100, a memory section 110, an interface section 120, and a terminal section 130. Programs and data are previously stored into the memory section 110 via the terminal section 130 and the interface section 120 in a suitable known way. For this purpose, the terminal section 130 includes a floppy disk drive, a magnetic tape drive, or another suitable device. The processing section 100 executes processing in accordance with the programs and the data held by the memory section 110. The programs are designed so as to optimize an organization of may discrete elements. The processing section 100 stores results of the processing into the memory section 110. After the processing is completed, the results of the processing are transferred from the memory section 110 to the terminal section 130 via the interface section 120. The results of the processing can be taken out from the terminal section 130 by use of a floppy disk, a magnetic tape, or other suitable recording medium.

Figure 1:
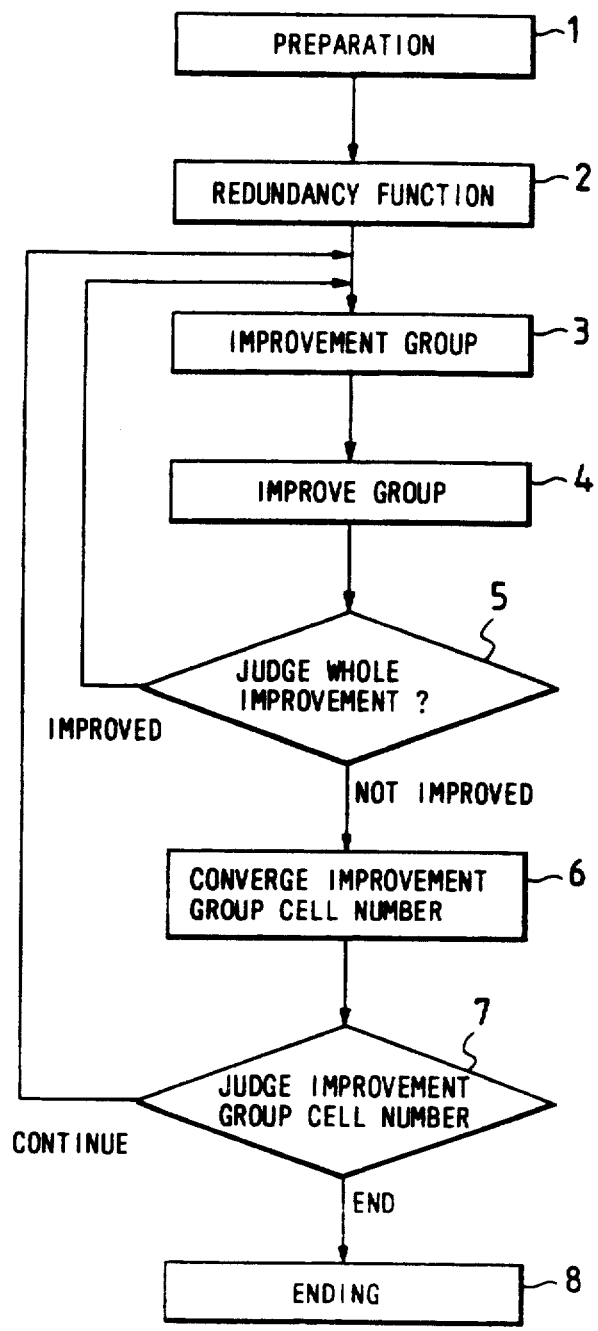
FIG. 1 is a general flowchart of the processing performed by an optimization system according to an embodiment of this invention.
Figure 2:
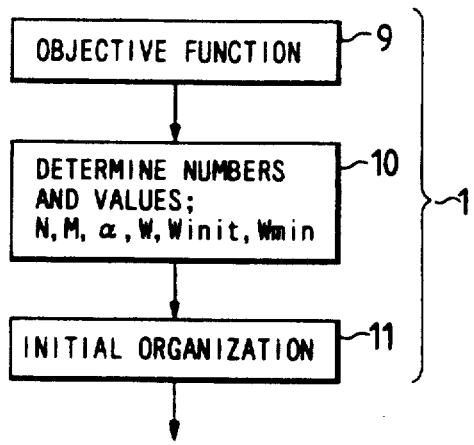
FIG. 2 is a detailed flowchart of block 1, FIG. 1.

FIG. 1 shows a flow of the processing in the optimization system of this embodiment. As described previously, the processing is executed in accordance with the computer programs. With reference to FIG. 1, a block (a means) 1 provides preparations for a main part of an optimization. As shown in FIG. 2, the block 1 includes sub blocks (means) 9, 10, and 11. The first sub block 9 determines an objective function F for evaluating the degree of the nearness of an element organization to an objective specification by use of a numerical value. Specifically, the objective function F has a value which decreases and increases as the element organization moves toward and away from the objective specification respectively. After the sub block 9, the processing advances to the sub block 10 which defines or determines various parameters used in the optimization. The determined parameters are the iteration number N of improvement for an improvement group of cells (elements), the iteration number M of improvement for the whole elements, the concentration parameter $\alpha$ for reducing the number of cells in an improvement group, the number W of cells in an improvement group, an initial number Winit of cells in an improvement group, and the smallest number Wmin of cells in an improvement group which equals the number W obtained at the end of the processing. After the sub block 10, the processing advances to the final sub block 11 which prepares an initial element organization used at the start of the processing.

Figure 3A:
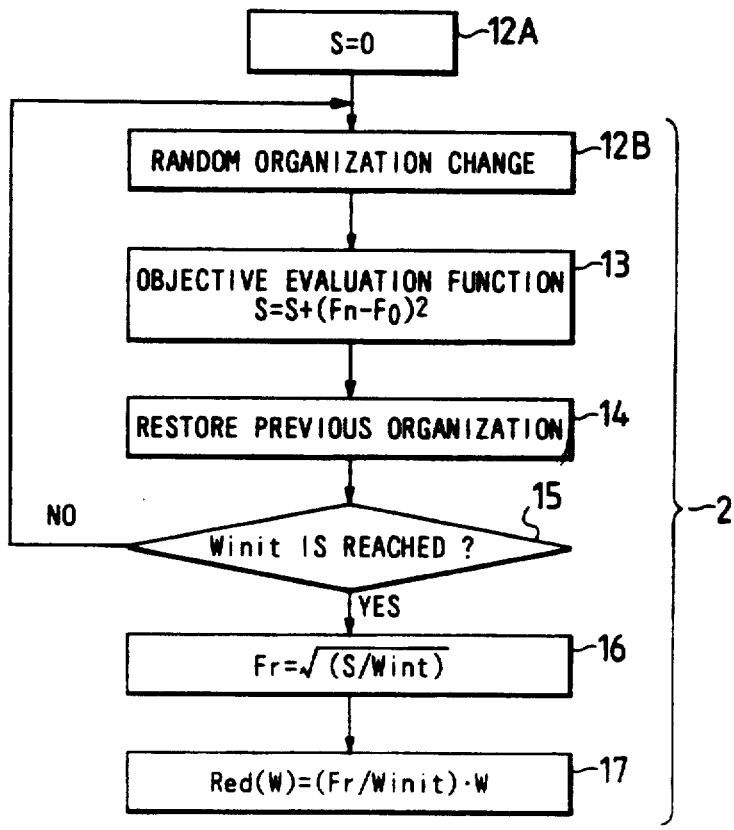
FIG. 3(a) is a detailed flowchart of block 2, FIG. 1.

In FIG. 1, after the block 1, the processing advances to a block (a means) 2 which determines a redundancy function. As shown in FIG. 3(a), the block 2 includes sub blocks (means) 12A and 12B, and 13-17. The first sub block 12A initializes the variable S to 0, the variable S representing an objective evaluation function. After the sub block 12A, the processing advances to the sub block 12B which changes the element organization at random. The sub block 13 following the sub block 12B calculates the objective evaluation function S by referring to the equation statement "$S = S + (Fn - Fo)^2$", where the character Fo denotes the current evaluation value and the character Fn denotes the evaluation value which occurs after the change. The sub block 14 following the sub block 13 restores the previous element organization. After the sub block 14, the processing advances to the sub block 15 which compares the number of times of the execution of the sub blocks 12-14 with the number Winit. When the number of times of the execution of the sub blocks 12-14 is smaller than the number Winit, the processing returns to the sub block 12. When the number of times of the execution of the sub blocks 12-14 reaches the number Winit, the processing advances to the subsequent sub block 16. Accordingly, the sub blocks 12-14 are reiterated the number of times which agrees with the number Winit. The sub block 16 calculates a value Fr of fluctuation, which is defined in statistics, by referring to the equation "$Fr = (S/Winit)^{\frac{1}{2}}$". The sub block 17 following the sub block 16 calculates a fluctuation per the number W on the basis of the fluctuation value Fr and defines the calculated fluctuation as a redundancy function Red(W). Specifically, the redundancy function Red(W) is calculated by referring to the equation "$Red(W) = (Fr/Winit) \cdot W$". The introduction of the fluctuation value Fr enables the examination of the range within which the objective function F fluctuates, thereby suitably determining the redundancy function Red(W) in the judgement on the improvement which has a redundancy. This point is one of features of the optimization system of this invention. As understood from the previous description, the redundancy function Red(W) estimates a variation of the objective function value, which is caused by a single change of the element organization, from the fluctuation value.

Figure 3B:
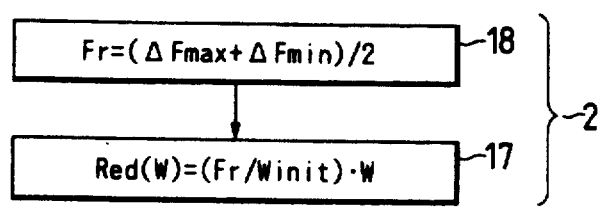
FIG. 3(b) is a detailed flowchart of block 2, FIG. 1.

FIG. 3(b) shows a modified block 2 which includes sub blocks 17 and 18. The first sub block 18 calculates a fluctuation value Fr by referring to an empirical equation. Specifically, the fluctuation value Fr is calculated by use of the equation "$Fr = (\Delta Fmax + \Delta Fmin)/2$", where the character $\Delta Fmax$ denotes an estimated maximum variation of the objective function value at the initial number Winit of cells and the character $\Delta Fmin$ denotes an estimated minimum variation of the objective function value at the smallest number Wmin of cells. After the sub block 18, the processing advances to the sub block 17 which calculates a redundancy function Red(W) by referring to the equation "$Red(W) = (Fr/Winit) \cdot W$".

Figure 4A:
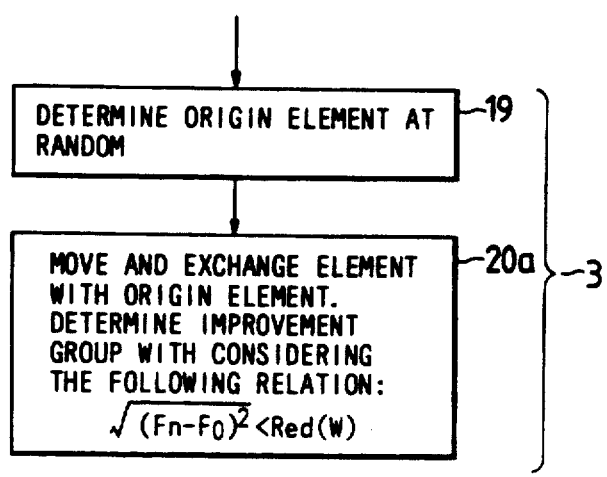
FIG. 4 is a detailed flowchart of block 3, FIG. 1.

In FIG. 1, after the block 2, the processing advances to a block (a means) 3 which determines an improvement group Dm of cells. As shown in FIG. 4(a), the block 3 includes sub blocks (means) 19 and 20a. The first sub block 19 determines an element constituting the origin of an improvement group of cells. Specifically, the origin element is determined at random by use of a random number so that every group of the element organization can be an object undergoing the improvement process. The sub block 20a following the sub block 19 determines the improvement group Dm in consideration of the origin element. In the optimization system of this embodiment, since the element organization is varied toward an optimal organization by suppressing the value of fluctuation caused by the exchange and movement of the element organizations, an improvement is made on an element group smaller than the value of the redundancy function Red(W) which corresponds to a fluctuation per element change of the objective function value responsive to a change of the element organization including the origin element, and thereby the fluctuation is reduced to a value equal to the concentration parameter multiplied by the redundancy function Red(W) which agrees with the fluctuation of the element organization of the improvement target. Therefore, the improvement group Dm of cells is determined by registering element groups smaller than the value of the redundancy function Red(W) which corresponds to a fluctuation per element change of the objective function value responsive to a change of the element organization including the origin element. Specifically, in the sub block 20a, an element is exchanged with the origin element through movement. After the exchange, the element is defined as the improvement group Dm if the element satisfies the condition "$\{(Fn-Fo)^2\}^{\frac{1}{2}} < Red(W)$" where the character Fo denotes the current evaluation value and the character Fn denotes the evaluation value which occurs after the exchange.

Figure 4B:
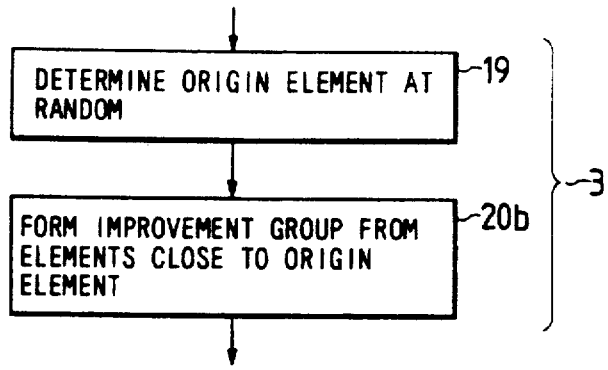

FIG. 4(b) shows a modified block 3 which includes sub blocks 19 and 20b. The first sub block 19 determines an origin element at random. The sub block 20b following the sub block 19 empirically determines an improvement group Dm of cells. Specifically, a W number of elements close to the origin element are used to compose the improvement group Dm.

Figure 5:
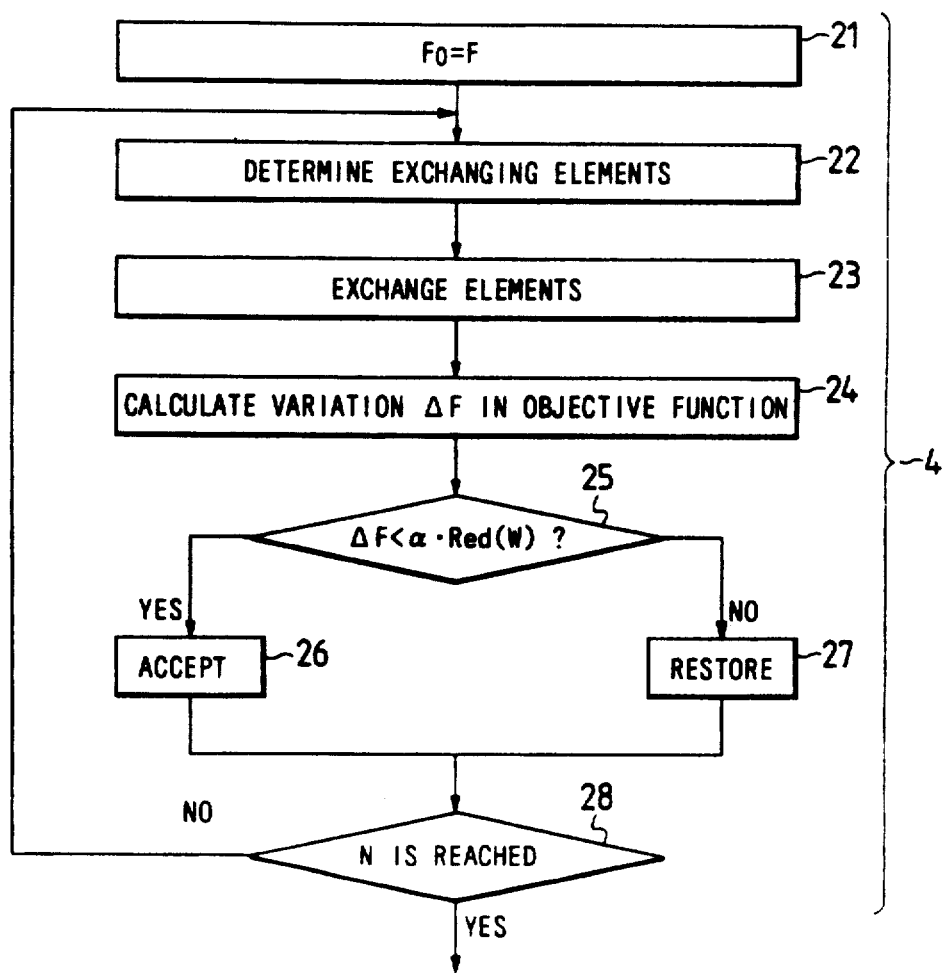
FIG. 5 is a detailed flowchart of block 4, FIG. 1.

In FIG. 1, after the block 3, the processing advances to a block (a means) 4 which improves the improvement group Dm. As shown in FIG. 5, the block 4 includes sub blocks (means) 21–28. The first sub block 21 calculates the value of the objective function F of the element organization which occurs before the improvement. Then, the sub block 21 sets the variable Fo to the calculated objective function value by referring to the equation statement "Fo=F". After the sub block 21, the processing advances to the sub block 22 which determines elements related to a change of the element organization within the improvement group. The sub block 23 following the sub block 22 changes the elements determined in the preceding sub block 22 and generates a new element organization. The sub block 24 following the sub block 23 calculates the difference ΔF between the objective function values in the preceding element organization and the new element organization. The sub block 25 following the sub block 24 compares the difference ΔF with the product of the concentration parameter α and the redundancy function Red(W) in order to determine whether or not the new element organization is acceptable. Thus, the redundancy function Red(W) is considered in the judgment on the new element organization. When the difference ΔF is smaller than the product, the processing advances from the sub block 25 to the sub block 26. When the difference ΔF is not smaller than the product, the processing advances from the sub block 25 to the sub block 27. The sub block 26 executes the acceptance of the new element organization. The sub block 27 rejects the new element organization and restores the preceding element organization. After the sub blocks 26 and 27, the processing advances to the sub block 28 which compares the number of times of the execution of the sub blocks 22–27 with the number N. When the number of times of the execution of the sub blocks 22–27 is smaller than the number N, the processing returns to the sub block 22. When the number of times of the execution of the sub blocks 22–27 reaches the number N, the processing exits from the block 4. Accordingly, the sub blocks 22–27 are reiterated the number of times which agrees with the number N.

Figure 6:
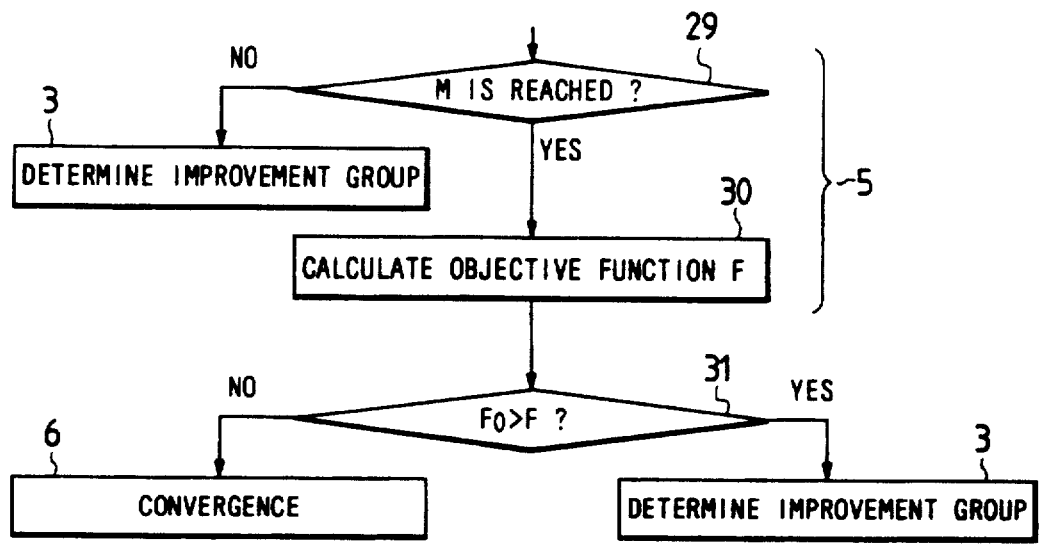
FIG. 6 is a detailed flowchart of block 5, FIG. 1.

In FIG. 1, after the block 4, the processing advances to a block (a means) 5 which makes a judgement on the improvement of the whole elements which is executed by the previous blocks 3 and 4. As shown in FIG. 6, the block 5 includes sub blocks (means) 29–31. The first sub block 29 compares the number of times of the execution of the improvement for the whole elements with the number M. When the number of times of the execution of the improvement for the whole elements is smaller than the number M, the processing returns to the block 3 (see FIG. 1). When the number of times of the execution of the improvement for the whole elements reaches the number M, the processing advances to the sub block 30. The sub block 30 calculates an average of the objective function values F. The sub block 31 compares the average objective function value F with the evaluation function value Fo which occurs before the improvement. When the average objective function value F is smaller than the evaluation function value Fo, that is, when the improvement is positive, the processing returns to the block 3 (see FIG. 1) and the same number W of cells in an improvement group is maintained. When the average objective function value F is not smaller than the evaluation function value Fo, that is, when the improvement is negative, the processing exits from the block 5 and advances to a subsequent block 6 (see FIG. 1) which reduces the number W of cells in an improvement group as will be described later.

Figure 7:
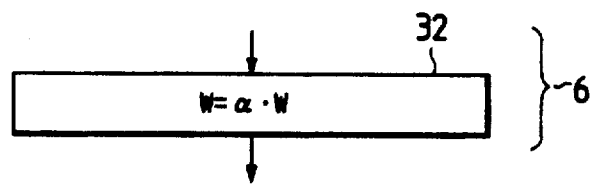
FIG. 7 is a detailed flowchart of block 6, FIG. 1.

As shown in FIG. 7, the block 6 includes a sub block 32 which updates the number W of cells in an improvement group in such a manner as to reduce the number W. Specifically, the sub block 32 executes the equation statement "$W = \alpha \cdot W$" where the character α denotes the concentration parameter.

Figure 8:
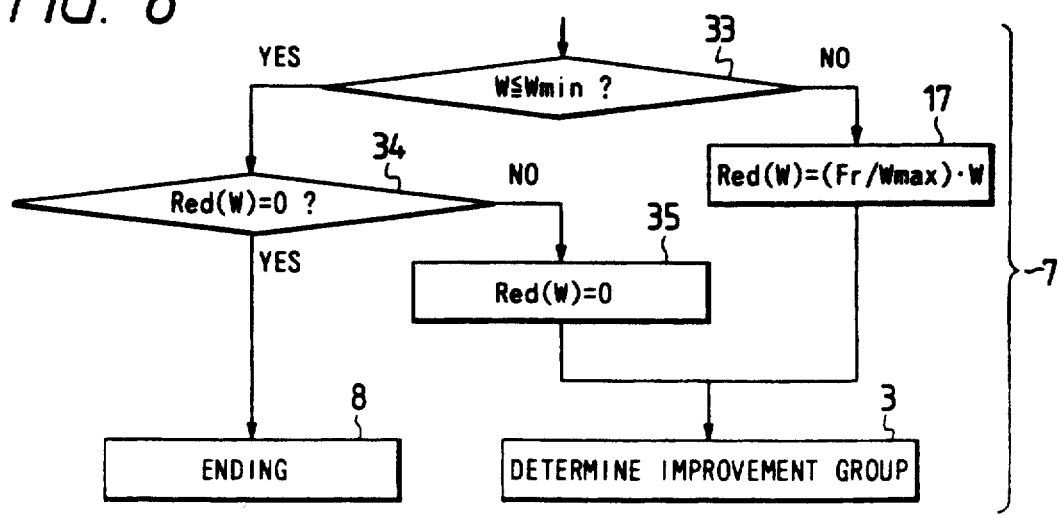
FIG. 8 is a detailed flowchart of block 7, FIG. 1.

In FIG. 1, after the block 6, the processing advances to a block (a means) 7 which makes a judgment on the smallest number Wmin of cells in an improvement group. As shown in FIG. 8, the block 7 includes sub blocks (means) 17 and 33–35. The first sub block 33 compares the number W of cells in an improvement group with the smallest number Wmin of cells in an improvement group. When the number W is equal to or smaller than the smallest number Wmin, the processing advances to the sub block 34. When the number W is greater than the smallest number Wmin, the processing advances to the sub block 17. The sub block 17 calculates the redundancy function Red(W) by referring to the equation "$Red(W) = (Fr/Winit) \cdot W$". The sub block 17 functions to newly reduce the fluctuation. After the sub block 17, the processing returns to the block 3 (see FIG. 1). The sub block 34 compares the redundancy function value Red(W) with 0. When the redundancy function value Red(W) equals 0 and thus a further improvement can not be expected, the processing advances to a block 8 (see FIG. 1) which finishes the processing. When the redundancy function value Red(W) differs from 0, the processing advances to the sub block 35 which sets the redundancy function value Red(W) to 0. After the sub block 35, the processing returns to the block 3 (see FIG. 1).

The operation of the optimization system of this embodiment will be further described in two example cases corresponding to the travelling salesman problem and the bipartitional min-cut problem respectively.

TRAVELLING SALESMAN PROBLEM

The travelling salesman problem is equivalent to an optimization of substance transportation or information transmission. It is now assumed that there are cities and a salesman starts from an arbitrary one of the cities and travels to all of the cities via a path without duplication. The resolution of the travelling salesman problem is to determine the shortest path and the travelling orders of the cities. During the sequential travel to the cities from the starting city, if there is a path which enables the return to the starting city by only a smallest movement, such a path is optimal.

Figure 9A:
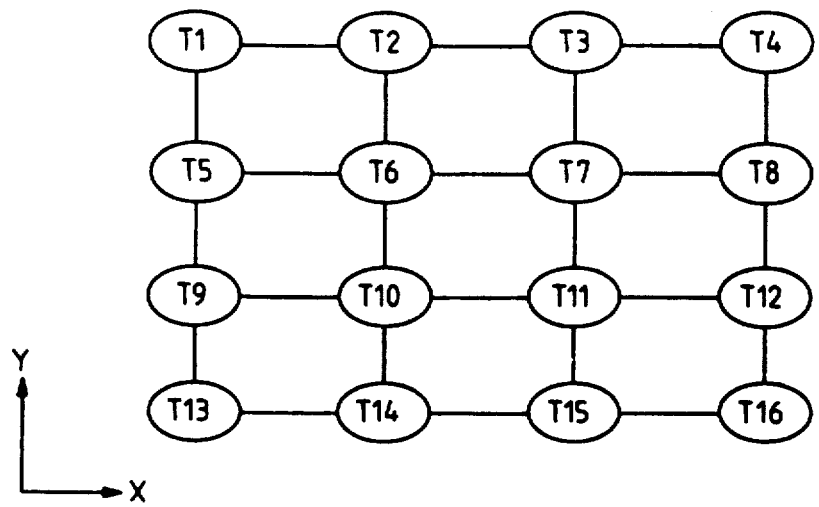
FIGS. 9(a)-9(g) are diagrams of organizations of elements which relate to the travelling salesman problem in the optimization system of FIG. 1.
Figure 9B:
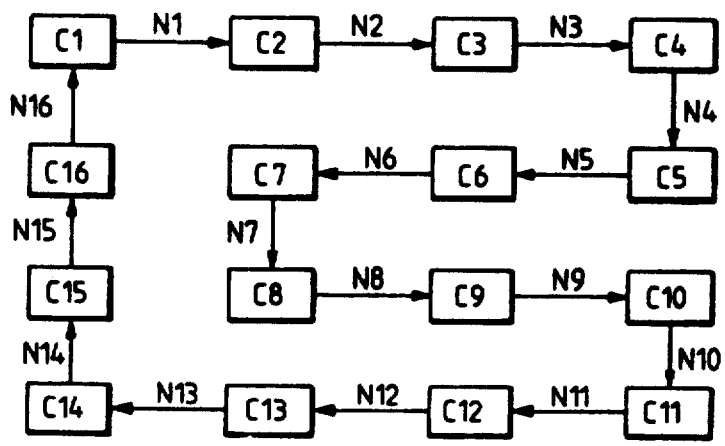

A group of 16 cities is handled in the travelling salesman problem. As shown in FIG. 9(a), cities T1–T16 composing a group are arranged in a two-dimensional lattice which has 4 rows and 4 columns extending in X and Y directions respectively. As shown in FIG. 9(b), the travelling orders of the cities are represented by the respective characters C1–C16, and the connections between the adjacent cities as viewed in the travelling orders are represented by the respective characters N1–N16.

Figure 9C:
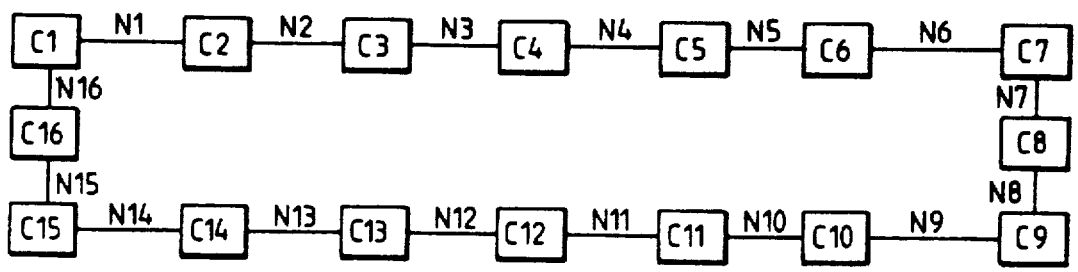

If the travelling orders C1–C16 are regarded as respective elements (cells) and the connections N1–N16 are regarded as respective connections of the adjacent elements, the travelling salesman problem is equal to a problem related to the assignment of the elements C1–C16, which have the connection relations N1–N16 as shown in FIG. 9(c), to the lattice points T1–T16 of FIG. 9(a). An optimal element organization is equivalent to such an element assignment as to minimize the total distance of the connections N1–N16 in the assignment problem.

In view of the previous description, the sub block 9 of the block 1 determines the objective function F by referring to the following equation.

$$F = \Sigma_i \Sigma_j (R_{ij})^2$$

where the characters $\Sigma_i \Sigma_j$ denote operators of calculating the summation of R for all the elements, and the character $R_{ij}$ denotes the distance between the lattice points at which the elements Ci and Cj are located respectively. The distance $R_{ij}$ equals 0 when the elements Ci and Cj have no relation of connection. The sub block 10 of the block 1 uses the following values.

The number W of cells in an improvement group equals 16.

The initial number Winit of cells in an improvement group equals 16.

The number of the whole elements equals 16.

The smallest number Wmin of cells in an improvement group equals 4.

The minimum element adjacent group of cells equals 4.

The iteration number N of improvement for an improvement group equals the number W.

The iteration number M of improvement for the whole elements equals 20·Winit/N, where 20 is chosen arbitrarily. The concentration parameter $\alpha$ equals 0.9.

Figure 9D:
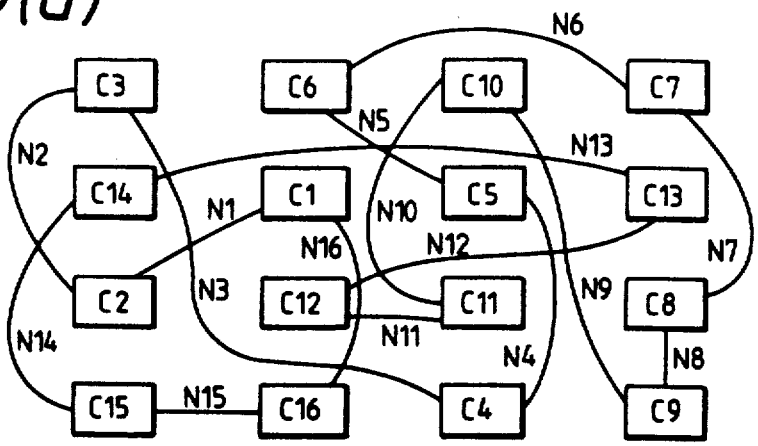

The values W, Wmin, Wmax, M, and N use integers obtained by omitting the figures below the decimal points. The reason for the use of the value "20" is that each element is expected to be processed about 20 times in average for each improvement. Any value may be used in place of "20". FIG. 9(d) shows an initial element organization which is obtained by arbitrarily changing and moving the elements the Winit number of times.

The sub block 16 of the block 2 calculates the fluctuation value Fr by referring to the following equation.

$$Fr = [\Sigma S^2 / W\text{init}]^{\frac{1}{2}}$$

where $S = \Sigma \Delta F^2$. The character $\Delta F$ denotes the difference between the objective function values Fo and Fn which occur before and after the exchange respectively. The character S denotes the summation of the squares of the respective differences $\Delta F$ in the case where the elements are exchanged at random the Winit number of times within the improvement group Dm. As described previously, the redundancy function Red(W) is expressed by the following equation.

$$Red(W) = (Fr/W\text{init}) \cdot W$$

Here, the processing is performed the Winit number of times. This number of times may be arbitrary.

Figure 9E:
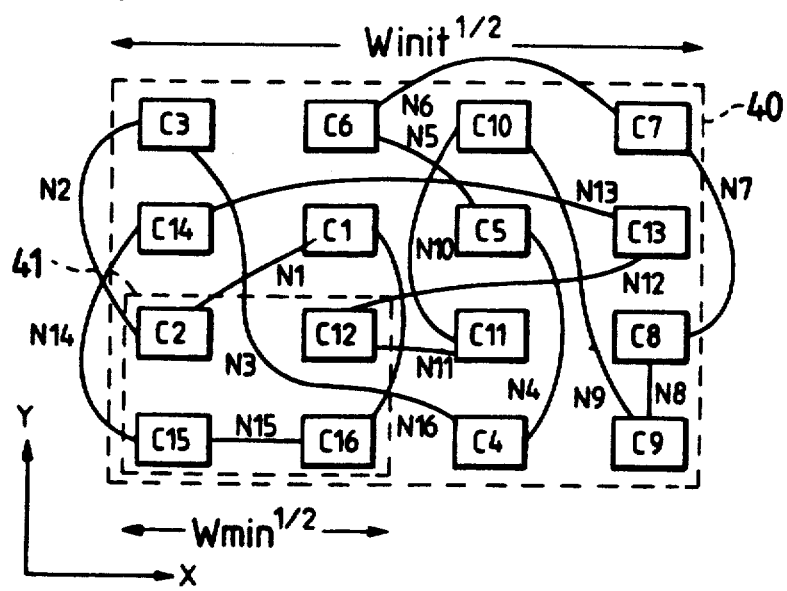

According to the block 3 of FIG. 3(b), the fluctuation value Fr is calculated as follows. In cases where the number of wiring lines connecting to each element is 2 and the number of cells in an improvement group equals the value Winit, if the element exchange and movement cause the movement through the longest distance "Winit$^{\frac{1}{2}}$" characterized by the length of a side of an initial improvement group 40 of cells which is shown in FIG. 9(e), the maximum objective function value difference $\Delta F$max is expressed by the following equation.

$$\Delta F\text{max} = 2 \cdot 2 \cdot (W\text{init}^{\frac{1}{2}})^2$$

where the respective constants "2" are determined on the basis of the fact that the number of wiring lines per element is 2 and there are two directions (X and Y directions). The smallest objective function value difference $\Delta F$min is obtained by the element exchange through the smallest distance "Wmin$^{\frac{1}{2}}$" characterized by the length of a side of the smallest improvement group 41 of cells which is shown in FIG. 9(e). Specifically, the smallest objective function value difference $\Delta F$min is expressed by the following equation.

$$\Delta F\text{min} = 2 \cdot 2 \cdot (W\text{min}^{\frac{1}{2}})^2$$

The fluctuation value Fr is defined as being equal to an average between the maximum difference $\Delta F$max and the minimum difference $\Delta F$min. Therefore, the fluctuation value Fr is expressed by the following equation.

$$Fr = 2 \cdot 2 \cdot \{(W\text{init} + W\text{min})\}/2$$

Thus, the redundancy function Red(W) is expressed by the following equation.

$$Red(W) = 2 \cdot (W\text{init} + W\text{min})/W\text{init}^{\frac{1}{2}}$$

As long as the number W of cells in an improvement group remains unchanged, the redundancy function value Red(W) is fixed. The exchange and movement of elements within the improvement group generates a new element organization. The judgment on the acceptance and the rejection of the new element organization uses the redundancy function Red(W) multiplied by the concentration parameter $\alpha$ as will be described later.

The sub block 19 of the block 3 determines an origin element at random. In the sub block 20a of the block 3 which follows the sub block 19, the improvement group Dm is formed by the element group having an element group number equal to or smaller than the value W where the objective function value remains within a given value under the change of the element organization including the origin element.

Figure 9F:
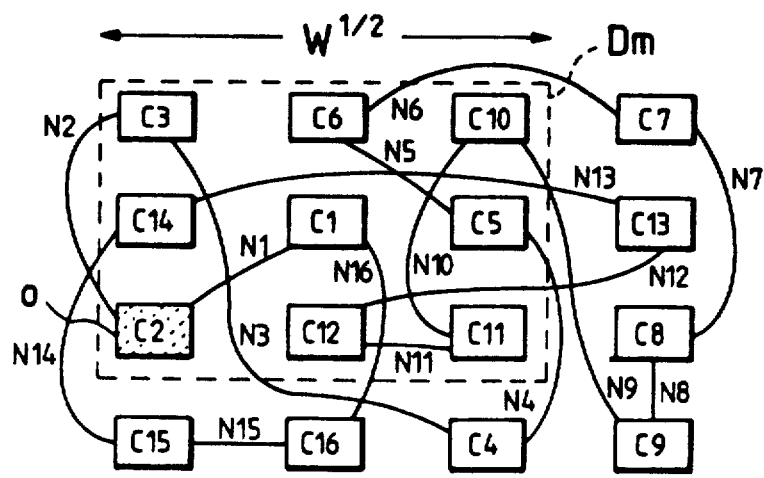
Figure 9G:
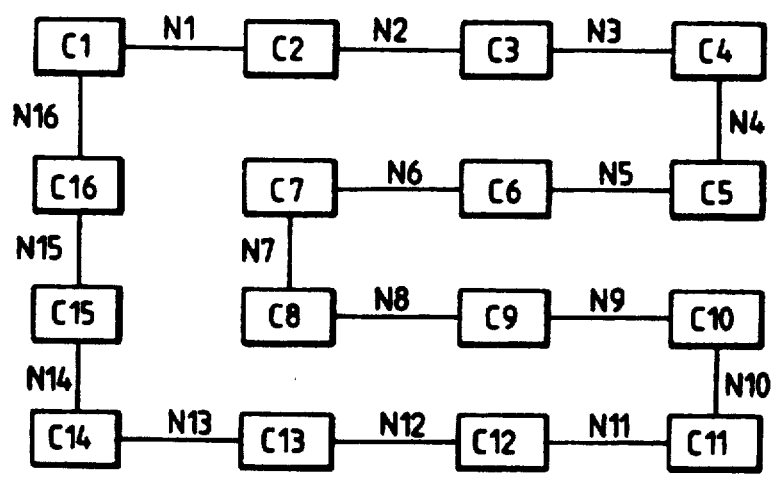

According to the block 3 of FIG. 4(b), the improvement group Dm is determined as follows. For example, an origin element is defined as being located at the left-hand low corner of an improvement group Dm. By referring to this relation between the origin element and the improvement group Dm, the improvement group Dm is determined in accordance with the selection of the origin element. As shown in FIG. 9(f), when the element C2 is chosen as an origin element 0 for example, the determined improvement group Dm corresponds to a rectangle defined by the broken lines. In the case where the coordinate of the origin element is represented by Xg and Yg, the vertexes of the rectangle of the improvement group Dm have the following coordinates: (Xg, Yg), (Xg+W$^{\frac{1}{2}}$−1, Yg), (Xg, Yg+W$^{\frac{1}{2}}$−1), and (Xg+W$^{\frac{1}{2}}$−1).

The block 4 generally functions to minimize the objective function value by exchanging and moving elements within the improvement group Dm. Here, only exchange is performed. The sequence of the exchange will be indicated below.

1) Sub block 21 of FIG. 5: The objective function value of the element organization which occurs before the improvement is represented by the variable Fo. In addition, the objective function value of the current element organization is represented by the variable Fn. (Fn=Fo)

2) Sub blocks 22 and 23 of FIG. 5: Two elements within the improvement group are selected at random and they are exchanged.

3) Sub block 24 of FIG. 5: The difference between the objective function values Fn and Fm is calculated and is represented by the variable ΔF, where the values Fn and Fm are obtained before and after the exchange respectively. (ΔF=Fm−Fn)

4) Sub block 25 of FIG. 5: When the difference ΔF is smaller than the value equal to the concentration parameter α multiplied by the redundancy function Red(W), the element organization which occurs after the exchange is accepted and then the sub block 26 performing "Fn=Fm" is executed. Otherwise, the sub block 27 for restoring the element organization which occurs before the exchange is executed.

5) Sub block 28 of FIG. 5: The above-mentioned processings 2)–4) are performed the N number of times.

The sub block 29 of the block 5 judges whether or not the blocks 3 and 4 are executed the M number of times, in order to confirm that improvement groups are set throughout the whole or global element organization. The sub block 30 of the block 5 calculates the objective function F which occurs after the improvement. The sub block 31 of the block 5 compares the value F and the value Fo. When the value F is smaller than the value Fo, the processing advances to the block 3 and the same number of cells in an improvement group is maintained. When the value F is not smaller than the value Fo, the processing advances to the block 6 since a further improvement can not be expected.

The block 6 updates the number W of cells in an improvement group by executing the equation statement "W=α·W", where the character α denotes the concentration parameter.

The block 7 determines whether the processing should be continued or finished.

FIG. 9 shows a final element organization which is obtained as a result of the processing. As understood from FIG. 9, the final element organization agrees with an optimal element organization which has the shortest path N1–N16 connecting the elements C1–C16.

FIGS. 10(a)–10(f) show the programs used in the processing. FIGS. 10(a) and 10(b) show the first half and the second half of a main program. FIG. 10(c) shows a program for generating input information and an initial placement. FIG. 10(d) shows a program related to processes of selecting cell elements and exchanging cell elements. FIG. 10(e) shows a program related to processes of calculating an objective function F and outputting a drawing. The programs are written in standard C language.

FIG. 11 shows the relation between the objective function value and the number of times of the execution of the reiterative portion of the processing. The optimization system of this embodiment is capable of deriving an optimal cell placement in consideration of the whole cells. This feature is understood from the following fact. As shown at the stages E1–E3, after a locally-improved placement is obtained which has a first minimal objective function value, the improvement processing changes the locally-improved placement to a worse placement having a higher objective function value and then the improvement processing changes the worse placement to an excellent placement which has an objective function value smaller than the first minimal objective function value and which is better than the locally-improved placement.

BIPARTITIONAL MIN-CUT PROBLEM

Figure 12A:
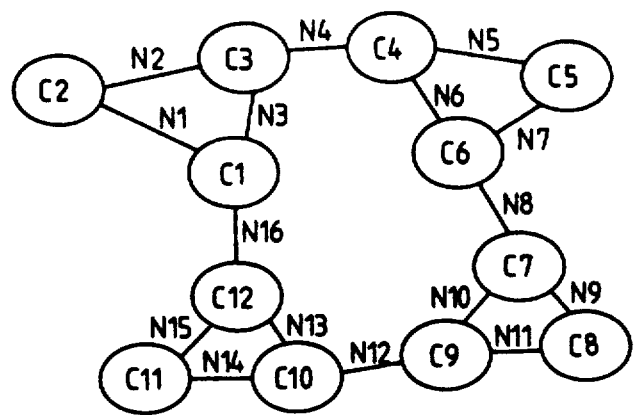
FIGS. 12(a)-12(g) are diagrams of organizations of elements which relate to the bipartitional min-cut problem in the optimization system of FIG. 1.
Figure 12B:
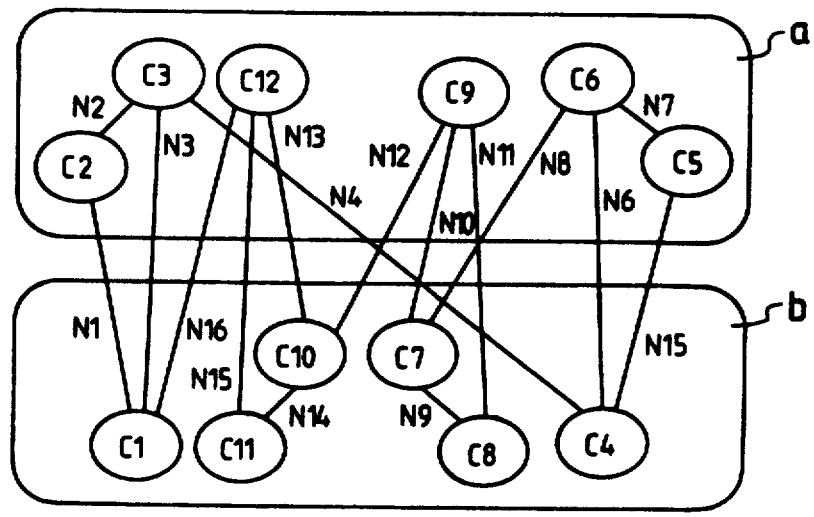

The bipartitional min-cut problem arises in the designing of an LSI logic circuit. It is now assumed that elements of a logic circuit are separated into two groups. The bipartitional min-cut problem relates to the determination of a combination of the separation in which the relation of the connection between the two groups or the nets crossing between the two groups is the sparsest and the area occupied by the circuit elements in the first group is as close as possible to the area occupied by the circuit elements in the second group. FIG. 12(a) shows a logic circuit having circuit elements C1–C12 and the connection net relation N1–N16 therebetween. FIG. 12(b) shows an initial element organization in which circuit elements C1–C12 are separated at random into two groups "a" and "b". FIGS. 12(c)–12(f) shows intermediate element organizations obtained in the processing by this embodiment. FIG. 12(g) shows a final element organization obtained as a result of the processing by this embodiment.

In view of the previous description, since the number of the nets crossing between the two separated groups is required to be minimized, the sub block 9 of the block 1 determines the objective function F by referring to the following equation.

$$F = \Sigma_i (K_i)^2$$

where the character $\Sigma_i$ denotes an operator of calculating the summation of K for all the elements, and the character $K_i$ denotes a function whose value is 0 when the "i"-th net corresponds to a net between circuit elements within the same separated group, and whose value is 1 when the "i"-th net corresponds to a net between circuit elements within the respective separated groups. The sub block 10 of the block 1 uses the following values.

The number W of cells in an improvement group equals 12. The initial number Winit of cells in an improvement group equals 12.

The number of the whole elements related to the crossing nets equals 12.

The smallest number Wmin of cells in an improvement group which relate to the crossing nets equals 0.

The iteration number N of improvement for an improvement group equals the number W.

The iteration number M of improvement for the whole elements equals 20·Winit/N, where 20 is chosen arbitrarily.

The concentration parameter α equals 0.9. The sub block 11 of the block 1 exchanges elements at random and thereby generates an initial element organization of FIG. 12(b).

According to the block 3 of FIG. 3(b), the fluctuation value Fr is calculated as follows. The number of wiring lines connecting to each element is 3 so that the maximum objective function value difference ΔFmax is expressed by the following equation.

$$\Delta Fmax = 2\cdot(\text{average net connection number}) = 2\cdot 3$$

where the constant "2" is provided in consideration of element exchange. The smallest objective function value difference ΔFmin is expressed by the following equation.

$$\Delta Fmin = 0$$

The fluctuation value Fr is defined as being equal to an average between the maximum difference ΔFmax and the minimum difference ΔFmin. Therefore, the fluctuation value Fr is expressed by the following equation.

$$Fr = 3$$

Thus, the redundancy function Red(W) is expressed by the following equation.

$$Red(W) = 3/Winit\cdot W$$

As long as the number W of cells in an improvement group remains unchanged, the redundancy function value Red(W) is fixed. The exchange and movement of elements within the improvement group generates a new element organization. The judgment on the acceptance and the rejection of the new element organization uses the redundancy function Red(W) multiplied by the concentration parameter α as will be described later.

The sub block 19 of the block 3 selects a crossing net 43 (see FIG. 12) at random and defines an element connecting to the crossing net 43 as an origin element. According to the block 3 of FIG. 4(b), the sub block 19 is followed by the sub block 20b. The sub block 20b selects crossing nets 43 until the number W of cells in an improvement group is reached, and the sub block 20b adds elements, connecting the selected crossing nets 43, into the improvement group Dm. In this way, the improvement group Dm is determined. In FIGS. 12(c)–12(f), the elements 44 within the improvement groups Dm are represented by hatched circles.

The block 4 generally functions to minimize the objective function value by exchanging the elements 44 within the improvement group Dm. The sequence of the exchange will be indicated below.

1) Sub block 21 of FIG. 5: The objective function value of the element organization which occurs before the improvement is represented by the variable Fo. In addition, the objective function value of the current element organization is represented by the variable Fn. (Fn=Fo)

2) Sub blocks 22 and 33 of FIG. 5: Two elements within the improvement group are selected at random and they are exchanged.

3) Sub block 24 of FIG. 5: The difference between the objective function values Fn and Fm is calculated and is represented by the variable ΔF, where the values Fn and Fm are obtained before and after the exchange respectively.

$$(\Delta F = Fm - Fn)$$

4) Sub block 25 of FIG. 5: When the difference ΔF is smaller than the value equal to the concentration parameter α multiplied by the redundancy function Red (W), the element organization which occurs after the exchange is accepted and then the sub block 26 performing "Fn=Fm" is executed. Otherwise, the sub block 27 for restoring the element organization which occurs before the exchange is executed 5) Sub block 28 of FIG. 5: The above-mentioned processings 2)–4) are performed the N number of times.

The sub block 29 of the block 5 judges whether or not the blocks 3 and 4 are executed the M number of times, in order to confirm that improvement groups are set throughout the whole element organization. The sub block 30 of the block 5 calculates the objective function F which occurs after the improvement. The sub block 31 of the block 5 compares the value F and the value Fo. When the value F is smaller than the value Fo, the processing advances to the block 3 and the same number of cells in an improvement group is maintained. When the value F is not smaller than the value Fo, the processing advances to the block 6 since a further improvement can not be expected.

The block 6 updates the number W of cells in an improvement group by executing the equation statement "$W = \alpha \cdot W$", where the character α denotes the concentration parameter.

The block 7 determines whether the processing should be continued or finished.

Figure 12C:
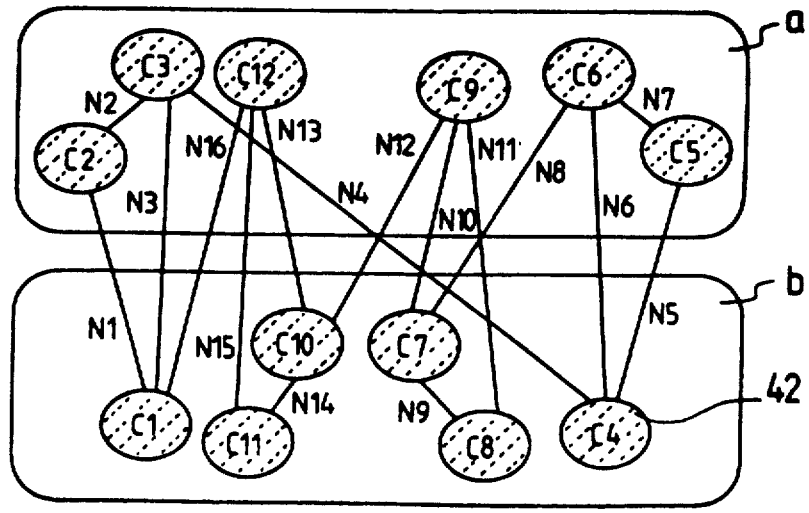
Figure 12D:
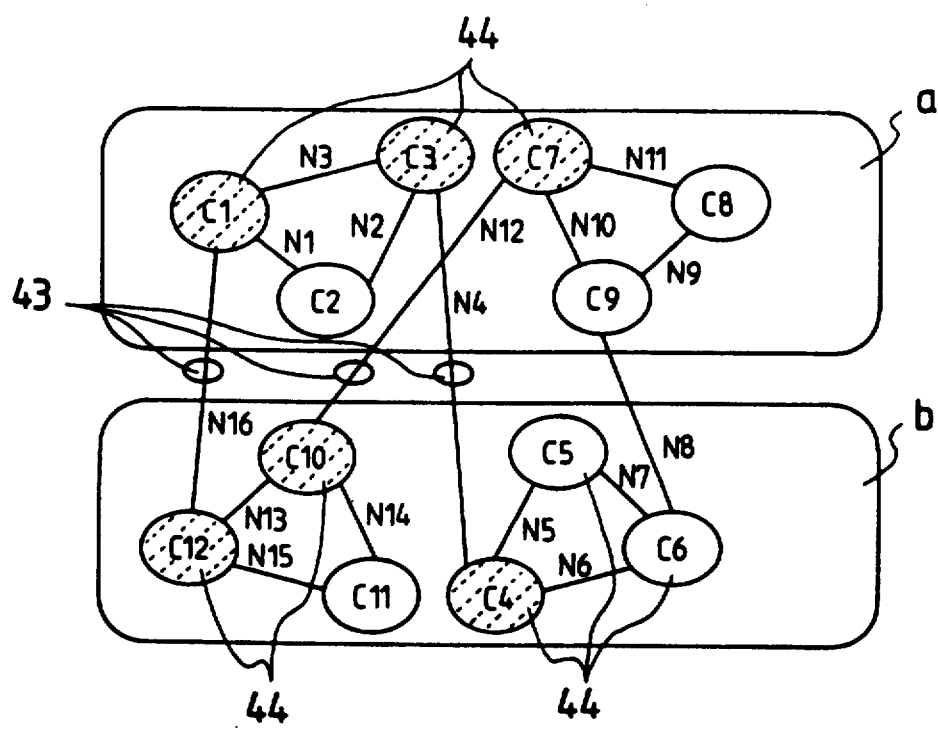
Figure 12E:
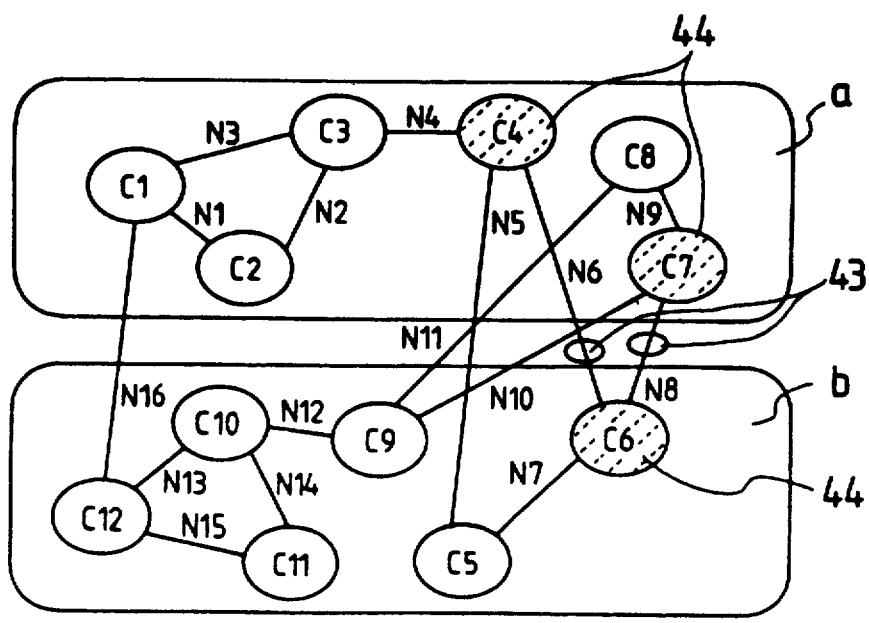
Figure 12F:
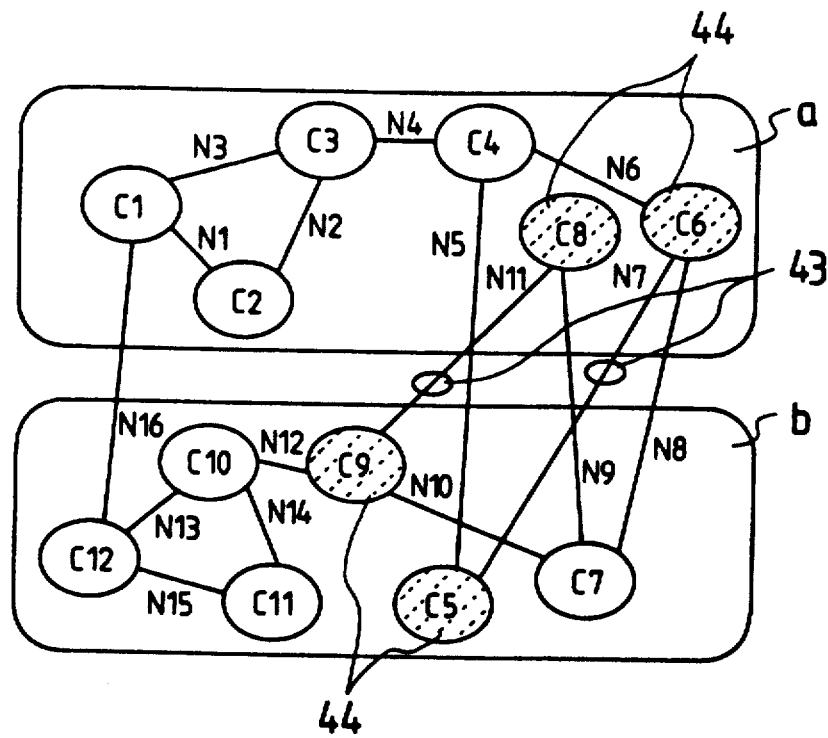
Figure 12G:
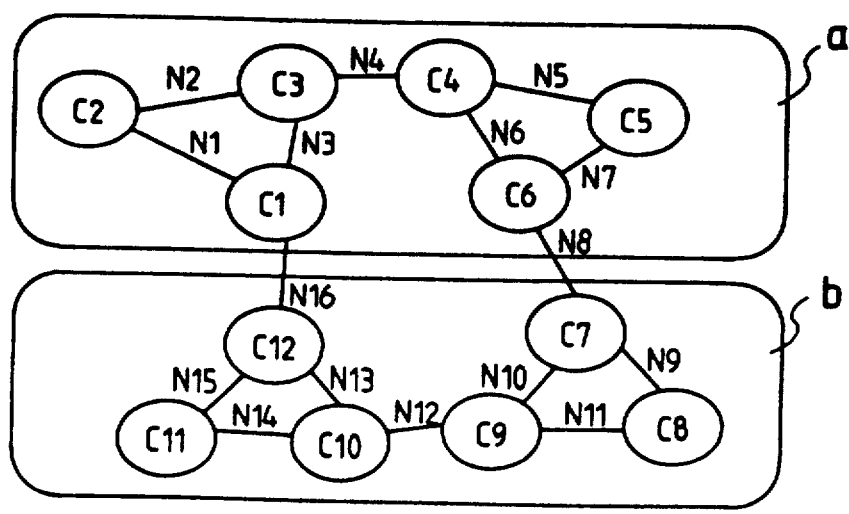

In FIG. 12(c), all of the elements connecting to at least one of the crossing nets N1, N3, N16, N15, N13, N12, N11, N10, N8, N6, and N5 are represented by the hatched circles and compose the improvement group. The improvement and concentration processing changes the element organization of FIG. 12(c) into an element organization of FIG. 12(d). In FIG. 12(d), six elements connecting the crossing nets N16, N12, and N4 and represented by the hatched circles compose the improvement group. The further improvement and concentration processing changes the element organization of FIG. 12(d), into an element organization of FIG. 12(e). In FIG. 12(e), three elements connecting the crossing nets N6 and N8 and represented by the hatched circles compose the improvement group. FIG. 12(f) shows another element organization at the number W of cells in an improvement group which is the same as that in the case of FIG. 12(e). In FIG. 12(f), four elements connecting the crossing nets N11 and N7 and represented by the hatched circles compose the improvement group. FIG. 12(g) shows a final element organization which is obtained as a result of the processing. As understood from FIG. 12(g), the final element organization agrees with an optimal element organization in which the number of crossing nets is the smallest and the same numbers of the elements reside in the respective two separated groups.

According to this embodiment, while the optimization is gradually advanced, the block 1 for determining the number of cells (elements) in an improvement group and the block 3 for determining an improvement group of cells enables the efficient improvement of the element organization. The efficient improvement results in a low CPU cost. Since the block 2 determines the redundancy function in consideration of the fluctuation in the value of the objective function of the element organization, the block 4 can perform suitable changes of the improvement group by use of the definite redundancy.

Since the sub block 25 of the block 4 enables temporal acceptance of an element placement which is worse than the preceding element placement by a degree dependent on the concentration parameter and the redundancy function value, a final cell placement can be obtained in consideration of the global or whole cell placement but regardless of whether or not a local cell placement is good. Accordingly, the final cell placement can be adequately close to an optimal cell placement. The block 6 reduces the number of cells in an improvement group by using the function synchronous with the number of cells in an improvement group, and the redundancy can be converged. Finally, the sub block 35 of the block 7 sets the redundancy to 0 and thus the optimization processing can be converged. Accordingly, the finally-obtained element organization is stable and excellent.

What is claimed is:

1. A computer implemented method of optimizing a physical organization of a plurality of mutually-related elements of an integrated circuit chip to establish a resulting chip size and performance, wherein the element organization is gradually changed toward an objective specification of circuit functionality with minimum production cost by local changes of the element organization, the method comprising the steps of:

a firts step including sub steps of:

defining an objective function whose value depends on a degree of a nearness of a particular element organization of a plurality of possible element organization of a plurality of possible element organizations to an objective specification of circuit functionality with minimum production cost.

defining an iteration number of improvement for each improvement group of elements in each of which several types of element organization could be generated, an iteration number of improvement for all elements of any improvement group, an initial number of elements in each improvement group, a smallest number of elements which can be improved in each improvement group, a total number of elements equal to said plurality of elements, and a concentration parameter that controls a group redundancy and a number of elements in each successive improvement group, and generating an initial element organization;

a second step including sub steps of:

performing at least one of random exchange and movement of elements in the initial element organization, calculating a fluctuation in a value of the objective function which responds to said random exchange and movement, calculating a value of said fluctuation which results from an execution of one time of said random exchange and movement, calculating a product of said fluctuation value and the number of elements in an improvement group and using said product of the fluctuation value and the number of elements in an improvement group as a redundancy function;

a third step including sub steps of selecting one of the elements at random and setting an improvement group of elements whose origin agrees with the selected element, wherein the number of elements in the improvement group is less than the total number of elements;

a fourth step including sub steps of:

calculating a value of the objective function of a current element organization.

changing the current element organization to a new element organization by performing at least one of exchange and movement of elements in the improvement group, calculating a value of the objective function of the new element organization, calculating a difference between the values of the objective functions of the current element organization and the new element organization, calculating a degree of redundancy on the basis of a product of the concentration parameter and a value of the redundancy function which corresponds to the organization of the improvement group, judging whether or not the objective function value difference is greater than the degree of redundancy, rejecting the new element organization and maintaining the current element organization when the objective function value difference is greater than the degree of redundancy, accepting the new element organization when the objective function value difference is not greater than the degree of redundancy, and reiterating said sub steps of the fourth step a number of times which agrees with the iteration number of improvement for each improvement group, wherein said third step and said fourth step correspond to a whole element organization improving process;

a fifth step including sub steps of:

reiterating the whole element organization improving process a number of times which agrees with the iteration number of improvement for all elements, calculating a value of the objective function which occurs after said reiterating of the whole element organization improving process, judging whether or not the objective function value which occurs after said reiterating of the whole element organization improving process is smaller than the objective function value which occurs before said reiterating of the whole element organization improving process, further repeating the whole element organization improving process a number of times which agrees with the iteration number of improvement for all elements when the objective function value which occurs after said reiterating of the whole element organization improving process is smaller than the objective function value which occurs before said reiterating of the whole element organization improving process, and performing a sixth step when the objective function value which occurs after said reiterating of the whole element organization improving process is not smaller than the objective function value which occurs before said reiterating of the whole element organization improving process;

said sixth step of multiplying a current number of elements in an improvement group by the concentration parameter to change the current number of elements in the improvement group into a new number of elements in the improvement group;

a seventh step including sub steps of:
- judging whether or not the new number of elements is greater than the smallest number of elements in an improvement group,
- calculating a value of the redundancy function related to the new number of elements and then preforming said third step when the new number of elements is greater than the smallest number of elements in an improvement group,
- judging whether or not the value of the redundancy function is equal to 0 when the new number of elements is not greater than the smallest number of elements in an improvement group,
- setting the value of the redundancy function to 0 and then performing the third step when the value of the redundancy function is not equal to 0, and
- performing an eighth step when the value of the redundancy function is equal to 0;

said eighth step of outputting a finally-obtained element organization which corresponds to an optimal element organization satisfying the circuit functionality and producing a smaller chip size; and a ninth step of organizing the elements of the integrated circuit chip in accordance with the finally-obtained element organization thus reducing the production cost of the integrated circuit chip.

2. The method of claim 1 wherein said third step comprises:
- exchanging an element with the selected element at the origin of the improvement group to change the element organization;
- calculating a value of the objective function of the element organization which occurs before said exchanging related to the origin element;
- calculating a value of the objective function of the element organization which occurs after said exchanging related to the origin element;
- calculating a difference between the objective function values which occur before and after the exchanging related to the origin element;
- comparing a predetermined reference value and said difference between the objective function values which occur before and after the exchanging related to the origin element; and
- forming the improvement group of elements from a group of elements in which said difference between the objective function values which occur before and after the exchanging related to the origin element is equal to or less than the predetermined reference value.

3. A computer implemented method of optimizing a placement of a plurality of inter-related elements of an integrated circuit chip wherein degrees of the inter-relationship between the elements are represented by distances between the elements, and the element placement is gradually changed toward an objective specification of circuit functionality with minimum production cost by local changes of the element placement, the method comprising the steps of:

a first step including sub steps of:
- defining an objective function whose value depends on distances between the elements and on a degree of nearness of a particular element placement to an objective specification of circuit functionality with minimum production cost,
- defining an iteration number of improvement for each improvement group of elements in each of which several types of element placement could be generated, an iteration number of improvement for all elements of any improvement group, an initial number of elements in each improvement group, a smallest number of elements which can be improved in each improvement group, a total number of elements equal to said plurality of elements, and a concentration parameter that controls a group redundancy and a number of elements in each successive improvement group, and
- generating an initial element placement;

a second step including sub steps of
- moving and exchanging elements having average relations therebetween so that the elements are changed from conditions where the elements are distant from each other by a maximal distance of an improvement group into conditions where the elements are distant from each other by a minimal distance of an improvement group,
- calculating a difference between values of the objective function which occur before and after said average element moving and exchanging,
- using said difference between values of the objective function which occur before and after said average element moving and exchanging as a value of fluctuation per element,
- calculating a product of said fluctuation value and the area of an improvement group, and
- using said product of the fluctuation value and the area of an improvement group as a redundancy function;

a third step including sub steps of selecting one of the elements at random and setting an improvement group of elements whose origin agrees with the selected element, wherein the number of elements in the improvement group is less than the total number of elements;

a fourth step including sub steps of:
- calculating a value of the objective function of a current element placement,
- changing the current element placement to a new element placement by performing at least one of exchange and movement of elements in the improvement group,
- calculating a value of the objective function of the new element placement,
- calculating a difference between the values of the objective functions of the current element placement and the new element placement,
- calculating a degree of redundancy on the basis of a product of the concentration parameter and a value of the redundancy function which corresponds to the placement of the improvement group,
- judging whether or not the objective function value difference is greater than the degree of redundancy,
- rejecting the new element placement and maintaining the current element placement when the objective function value difference is greater than the degree of redundancy,
- accepting the new element placement when the objective function value difference is not greater than the degree of redundancy, and reiterating said sub steps of the fourth step a number of times which agrees with the iteration number of improvement for each improvement group, wherein said third step and said fourth step correspond to a whole element placement improving process;

a fifth step including sub steps of:

reiterating the whole element placement improving process a number of times which agrees with the iteration number of improvement for all elements, calculating an average of values of the objective function which occur before said reiterating of the whole element placement improving process and calculating an average of the values of the objective function which occur after said reiterating of the whole element placement improving process, judging whether or not the objective function value average which occurs after said reiterating of the whole element placement improving process is smaller than an average of the objective function values which occur before said reiterating of the whole element placement improving process, further repeating the whole element placement improving process a number of times which agrees with the iteration number of improvement for all elements when the objective function value average which occurs after said reiterating of the whole element placement improving process is smaller than the objective function value average which occurs before said reiterating of the whole element placement improving process, and performing a sixth step when the objective function value average which occurs after said reiterating of the whole element placement improving process is not smaller than the objective function value average which occurs before said reiterating of the whole element placement improving process;

said sixth step of multiplying a current number of elements in an improvement group by the concentration parameter to change the current number of elements in the improvement group into a new number of elements in the improvement group;

a seventh step including sub steps of:

judging whether or not the new number of elements is greater than the smallest number of elements in an improvement group, calculating a value of the redundancy function related to the new number of elements and then preforming said third step when the new number of elements is greater than the smallest number of elements in an improvement group, judging whether or not the value of the redundancy function is equal to 0 when the new number of elements is not greater than the smallest number of elements in an improvement group, setting the value of the redundancy function to 0 and then performing the third step when the value of the redundancy function is not equal to 0, and performing an eighth step when the value of the redundancy function is equal to 0;

said eighth step of outputting a finally-obtained element placement which corresponds to an optimal element placement satisfying the circuit functionality and producing a smaller chip size; and a ninth step of organizing the elements of the integrated circuit chip in accordance with the finally-obtained element placement thus reducing the production cost of the integrated circuit chip.

4. The method of claim 3 wherein said third step comprises:

exchanging an element with the selected element at the origin of the improvement group to change the element placement;

calculating a value of the objective function of the element placement which occurs before said exchanging related to the origin element;

calculating a value of the objective function of the element placement which occurs after said exchanging related to the origin element;

calculating a difference between the objective function values which occur before and after the exchanging related to the origin element;

comparing a predetermined reference value and said difference between the objective function values which occur before and after the exchanging related to the origin element; and forming the improvement group of elements from a group of elements in which said difference between the objective function values which occur before and after the exchanging related to the origin element is equal to or less than the predetermined reference value.

5. An apparatus for optimizing a physical organization of a plurality of mutually-related elements of an integrated circuit chip to establish a resulting chip size and performance, wherein the element organization is gradually changed toward an objective specification of circuit functionality with minimum production cost by local changes of the element organization, the apparatus including a programmed computer comprising:

first program means for defining an objective function whose value depends on a degree of a nearness of a particular element organization of a plurality of possible element organizations to an objective specification of circuit functionality with minimum production cost, said first program means further defining an iteration number of improvement for each improvement group of elements in each of which several types of element organization could be generated, an iteration number of improvement for all elements of any improvement group, an initial number of elements in each improvement group, a smallest number of elements which can be improved in each improvement group, a total number of elements equal to said plurality of elements, and a concentration parameter that controls a group redundancy and a number of elements in each successive improvement group, and said first program means generating an initial element organization;

second program means for performing at least one of random exchange and movement of elements in the initial element organization, calculating a fluctuation in a value of the objective function which responds to said random exchange and movement, calculating a value of said fluctuation which results from an execution of one time of said random exchange and movement, calculating a product of said fluctuation value and the number of elements in an improvement group, and using said product of the fluctuation value and the number of elements in an improvement group as a redundancy function;

third program means for selecting one of the elements at random and setting an improvement group of elements whose origin agrees with the selected element, wherein the number of elements in the improvement group is less than the total number of elements;

fourth program means for calculating a value of the objective function of a current element organization, changing the current element organization to a new element organization by performing at least one of exchange and movement of elements in the improvement group, calculating a value of the objective function of the new element organization, calculating a difference between the values of the objective functions of the current element organization and the new element organization, calculating a degree of redundancy on the basis of a product of the concentration parameter and a value of the redundancy function which corresponds to the organization of the improvement group, judging whether or not the objective function value difference is greater than the degree of redundancy, rejecting the new element organization and maintaining the current element organization when the objective function value difference is greater than the degree of redundancy, accepting the new element organization when the objective function value difference is not greater than the degree of redundancy, and reiterating said functions of the fourth program means a number of times which agrees with the iteration number of improvement for each improvement group, wherein said third program means and said fourth program means perform a whole element organization improving process;

fifth program means for reiterating the whole element organization improving process a number of times which agresss with te iteration number of improvement for all elements, calculating a value of the objective function which occurs after said reiterating of the whole element organization improving process, judging whether or not the objective function value which occurs after said reiterating of the whole element organization improving process is smaller than the objective function value which occurs before said reiterating of the whole element organization improving process, further repeating the whole element organization improving process a number of times which agress with the iteration number of improvement for all elements when the objective function value which occurs after said reiterating of the whole element organization improving process is smaller than the objective function value which occurs before said reiterating of the whole element organization improving process, and causing operation of a sixth program means when the objective function value which occurs after said reiterating of the whole element organization improving process is not smaller than the objective function value which occurs before said reiterating of the whole element organization improving process;

said sixth program means for multiplying a current number of elements in an improvement group by the concentration parameter to chnage the current number of elements in the improvement group into a new number of elements in the improvement group;

seventh program means for judging whether or not the new number of elements is greater than the smallest number of elements in an improvement group, calculating a value of the redundancy function related to the new number of elements and then causing operation of said third program means when the new number of elements is greater than the smallest number of elements in an improvement group, judging whether or not the value of the redundancy function is equal to 0 when the new number of elements is not greater than the smallest number of elements in an improvement group, setting the value of the redundancy function to 0 and then causing operation of said third program means when the value of the redundancy function is not equal to 0, and causing operation of an eight program means when the value of the redundancy function is equal to 0; and said eighth program means for outputting a finally-obtained element organization which corresponds to an optimal element organization satisfying the circuit functionality and producing a smaller chip size, thereby organizing the elements of the integrated circuit chip in accordance with the finally-obtained element organization thus reducing the production cost of the integrated circuit chip.

6. An apparatus for optimizing a placement of a plurality of inter-related elements of an integrated circuit chip wherein degrees of the inter-relationship between the elements are represented by distances between the elements, and the element placement is gradually changed toward an objective specification of circuit functionality with minimum production cost by local changes of the element placement, the apparatus including a programmed computer comprising:

first program means for defining an objective function whose value depends on the distances between the elements and on a degree of a nearness of a particular element placement to an objective specification of circuit functionality with minimum production cost, said first program means further defining an iteration number of improvement for each improvement group of elements in each of which several types of element placement could be generated, an iteration number of improvement for all elements of any improvement group, an initial number of elements in each improvement group, a smallest number of elements which can be improved in each improvement group, a total number of elements equal to said plurality of elements, and a concentration parameter that controls a group redundancy and a number of elements in each successive improvement group, and said first program means generating an initial element placement;

second program means for moving and exchanging elements having average relations therebetween so that the elements are changed from conditions where the elements are distant from each other by a maximal distance of an improvement group into conditions where the elements are distant from each other by a minimal distance of an improvement group, calculating a difference between values of the objective function which occur before and after said average element moving and exchanging, using said difference between values of the objective function which occur before and after said average element moving and exchanging as a value of fluctuation per element, calculating a product of said fluctuation value and the area of an improvement group, and using said product of the fluctuation value and the area of an improvement group as a redundancy function;

third program means for selecting one of the elements at random and setting an improvement group of elements whose origin agrees with the selected element, wherein the number of elements in the improvement group is less than the total number of elements;

fourth program means for calculating a value of the objective function of a current element placement, changing the current element placement to a new element placement by performing at least one of exchange and movement of elements in the improvements group, calculating a value of the objective function of the new element placement, calculating a difference between the values of the objective functions of the current element placement and the new element placement, calculating a degree of redundancy on the basis of a product of the concentration parameter and a value of the redundancy function which corresponds to the placement of the improvement group, judging whether or not the objective function value difference is greater than the degree of redundancy, rejecting the new element placement and maintaining the current element placement when the objective function value difference is greater than the degree of redundancy, accepting the new element placement when the objective function value difference is not greater than the degree of redundancy, and reiterating said functions of the fourth program means a number of times which agrees with the iteration number of improvement for each improvement group, wherein said third program means and said fourth program means perform a whole element placement improving process;

fifth program means for reiterating the whole element placement improving process a number of times which agrees with the iteration number of improvement for all elements, calculating an average of values of the objective function which occurs before said reiterating of the whole element placement improving process and calculating an average of the values of the objective function which occur after said reiterating of the whole element placement improving process, judging whether or not the objective function value average which occurs after said reiterating of the whole element placement improving process is smaller than an average of the objective function values which occur before said reiterating of the whole element placement improving process, further repeating the whole element placement improving process a number of times which agrees with the iteration number of improvement for all elements when the objective function value average which occurs after said reiterating of the whole element placement improving process is smaller than the objective function value average which occurs before said reiterating of the whole element placement improving process, and causing operation of a sixth program means when the objective function value average which occurs after said reiterating of the whole element placement improving process is not smaller than the objective function value average which occurs before said reiterating of the whole element placement improving process;

said sixth means for multiplying a current number of elements in an improvement group by the concentration parameter to change the current number of elements in the improvement group into a new number of elements in the improvement group;

seventh program means for judging whether or not the new number of elements is greater than the smallest number of elements in an improvement group, calculating a value of the redundancy function related to the new number of elements and then causing operation of said third means when the new number of elements is greater than the smallest number of elements in an improvement group, judging whether or not the value of the redundancy function is equal to 0 when the new number of elements is not greater than the smallest number of elements in an improvement group, setting the value of the redundancy function to 0 and then causing operation of said third program means when the value of the redundancy function is not equal to 0, and causing operation of an eighth program means when the value of the redundancy function is equal to 0; and said eighth program means for outputting a finally-obtained element placement which corresponds to an optimal element placement satisfying the circuit functionality and producing a smaller chip size, thereby organizing the elements of the integrated circuit chip in accordance with the finally-obtained element placement thus reducing the production cost of the integrated circuit chip.

* * * * *